(12) United States Patent
Tsukamoto et al.

(10) Patent No.: US 7,104,859 B2
(45) Date of Patent: Sep. 12, 2006

(54) METHODS FOR MANUFACTURING CARBON FIBERS, ELECTRON-EMITTING DEVICE, ELECTRON SOURCE, IMAGE DISPLAY APPARATUS, LIGHT BULB, AND SECONDARY BATTERY USING A THERMAL CVD METHOD

(75) Inventors: Takeo Tsukamoto, Kanagawa (JP); Shinichi Kawate, Kanagawa (JP); Kazunari Oyama, Kanagawa (JP); Takahiro Sato, Kanagawa (JP); Shin Kitamura, Kanagawa (JP); Kazuya Miyazaki, Kanagawa (JP); Takashi Iwaki, Tokyo (JP); Akira Shimazu, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 137 days.

(21) Appl. No.: 10/802,854

(22) Filed: Mar. 18, 2004

(65) Prior Publication Data

US 2004/0192151 A1    Sep. 30, 2004

(30) Foreign Application Priority Data

Mar. 25, 2003  (JP) ............................. 2003-082536
Mar. 3, 2004   (JP) ............................. 2004-058674

(51) Int. Cl.
*H01J 9/00*     (2006.01)
(52) U.S. Cl. ......................................... 445/23
(58) Field of Classification Search .. 423/447.1–447.9, 423/448; 445/23–25, 49–51; 438/22
See application file for complete search history.

(56) References Cited

U.S. PATENT DOCUMENTS

| | | | |
|---|---|---|---|
| 5,872,422 A | 2/1999 | Xu et al. .................... 313/311 |
| 6,090,363 A * | 7/2000 | Green et al. ............. 423/447.1 |
| 6,522,055 B1 | 2/2003 | Uemura et al. ............. 313/310 |
| 6,628,053 B1 | 9/2003 | Den et al. ..................... 313/10 |
| 6,630,772 B1 * | 10/2003 | Bower et al. ................ 313/311 |
| 6,652,923 B1 | 11/2003 | Uemura et al. ............. 427/575 |
| 6,656,007 B1 * | 12/2003 | Fushimi et al. ............... 445/24 |
| 6,720,728 B1 | 4/2004 | Den et al. ..................... 313/495 |
| 6,756,025 B1 * | 6/2004 | Colbert et al. ........... 423/447.3 |
| 2001/0028209 A1 | 10/2001 | Uemura et al. ............. 313/311 |
| 2002/0009637 A1 | 1/2002 | Murakami et al. .......... 429/213 |
| 2002/0031972 A1 | 3/2002 | Kitamura et al. .............. 445/3 |
| 2002/0047513 A1 | 4/2002 | Nomura ...................... 313/495 |
| 2002/0057045 A1 | 5/2002 | Tsukamoto .................. 313/309 |
| 2002/0060516 A1 | 5/2002 | Kawate et al. .............. 313/495 |
| 2002/0074947 A1 | 6/2002 | Tsukamoto .............. 315/169.3 |
| 2003/0006684 A1 | 1/2003 | Kawate et al. .............. 313/311 |
| 2003/0013372 A1 | 1/2003 | Uemura et al. ............... 445/24 |
| 2003/0048055 A1 | 3/2003 | Ishikura et al. ............. 313/311 |

(Continued)

FOREIGN PATENT DOCUMENTS

EP     0 913 508 A2    5/1999

(Continued)

*Primary Examiner*—Joseph Williams
(74) *Attorney, Agent, or Firm*—Fitzpatrick, Cella, Harper & Scinto

(57) ABSTRACT

In a method for manufacturing carbon fibers by means of a thermal CVD method through catalysts, the method capable of obtaining a uniform film thickness regardless of a growth position and a growth area on a substrate is provided. The substrate on which a catalyst layer is formed is disposed in a reaction container. An atmosphere in the reaction container is set to be a reduced pressure atmosphere including a carbon containing gas having a partial pressure of 10 Pa or less, and the substrate is heated in the atmosphere to grow carbon fibers on the catalyst layer.

23 Claims, 15 Drawing Sheets

U.S. PATENT DOCUMENTS

| | | | |
|---|---|---|---|
| 2003/0048056 A1 | 3/2003 | Kitamura et al. | 313/311 |
| 2003/0048057 A1 | 3/2003 | Oyama et al. | 313/311 |
| 2003/0057860 A1 | 3/2003 | Tsukamoto | 315/169.3 |
| 2004/0060477 A1 | 4/2004 | Iwaki et al. | 106/472 |
| 2004/0063839 A1 | 4/2004 | Kawate et al. | 524/439 |
| 2004/0116034 A1 | 6/2004 | Den et al. | 445/50 |
| 2004/0183757 A1 | 9/2004 | Oyama et al. | 345/75.2 |

FOREIGN PATENT DOCUMENTS

| | | |
|---|---|---|
| EP | 1 122 344 A2 | 8/2001 |
| EP | 1 126 494 A1 | 8/2001 |
| EP | 1 187 161 A2 | 3/2002 |
| EP | 1 245 704 A2 | 10/2002 |
| EP | 1 291 891 A2 | 3/2003 |
| JP | 2-46691 B2 | 10/1990 |
| JP | 11-11917 | 1/1999 |
| JP | 11-194134 | 7/1999 |
| JP | 2001-181842 | 7/2001 |
| JP | 2001-229806 | 8/2001 |
| JP | 2002-83604 | 3/2002 |
| JP | 2002-150925 | 5/2002 |
| JP | 2002-289086 | 10/2002 |
| JP | 2003-51244 | 2/2003 |
| JP | 2003-55768 | 2/2003 |
| JP | 2003-86077 | 3/2003 |

* cited by examiner

FIG. 2C1

FIBER AXIAL
DIRECTION

FIG. 2C2

FIBER AXIAL
DIRECTION

METHODS FOR MANUFACTURING CARBON FIBERS, ELECTRON-EMITTING DEVICE, ELECTRON SOURCE, IMAGE DISPLAY APPARATUS, LIGHT BULB, AND SECONDARY BATTERY USING A THERMAL CVD METHOD

BACKGROUND OF THE INVENTION

1. Field of the Invention

The present invention relates to a method for manufacturing(generating) carbon fibers by means of a thermal chemical vapor deposition (CVD) method using catalysts and a gas including carbon. Moreover, the present invention relates to methods for severally manufacturing an electron-emitting device and a light bulb, both using the carbon fibers as electron-emitting members, an electron source configured by using the electron-emitting devices, an image display apparatus such as a display configured by using the electron source, a secondary battery using the carbon fibers as cathodes, and the like. Furthermore, the present invention relates to a method for manufacturing an electronic device such as a circuit and a transistor using the carbon fibers.

2. Description of Related Art

There is a method for forming a plurality of carbon fibers in a desired region by means of the thermal CVD method performed successively after disposing a catalyst layer on a substrate. Moreover, there is a technique for using the carbon fibers manufactured by the thermal CVD method as electron-emitting members for an electron-emitting device, and further for an image-forming apparatus. Patent Documents 1–5 disclose electron-emitting devices using carbon fibers. Patent Documents 6–8 disclose methods for manufacturing carbon fibers. The thermal CVD method is a method for performing the excitation of source chemical species by heating them, and is generally inexpensive in comparison with a plasma CVD method and an optical CVD method.

Patent Document 1: European Patent Application Laid-Open No. 1,245,704
Patent Document 2: Japanese Patent Application Laid-Open No. 2002-150925
Patent Document 3: U.S. Pat. No. 5,872,422
Patent Document 4: Japanese Patent Application Laid-Open No. 2002-289086
Patent Document 5: Japanese Patent Application Laid-Open No. 2001-229806
Patent Document 6: Japanese Patent Application Laid-Open No. 2001-181842
Patent Document 7: Japanese Patent Application Laid-Open No. H11-11917
Patent Document 8: Japanese Patent Publication No. H2-46691

SUMMARY OF THE INVENTION

When it is tried to apply electron-emitting devices using the carbon fibers as electron-emitting members to an image display apparatus such as a flat panel display, it is necessary to arrange a plurality of the electron-emitting devices on the same substrate. Owing to the necessity, the carbon fibers must be formed at a plurality of positions. Moreover, when it is tried to obtain a great quantity of carbon fibers at a time by means of the thermal CVD method for any uses other than the use for a display, the carbon fibers are inevitably to be manufactured in a wide area on a substrate having a large area.

In particular, in case of arranging a great number of electron-emitting devices on a plane to manufacture a display, the necessity of changing the sizes and the arrangement density of the electron-emitting devices according to the size, the resolution and the like of the display arises.

Among the thermal CVD methods, an atmospheric pressure CVD (normal pressure CVD) method is preferable in the cost of an apparatus. However, when the present inventors produced carbon fibers in various sizes and in various kinds of arrangement density on substrates in various sizes, the inventors found that there were some cases in which deviation (unevenness) was generated in the growth condition (grown film thicknesses, growth rates and the like) of the carbon fibers in dependence on the areas of the regions in which the plurality of carbon fibers were formed (corresponding to formation regions of the catalyst layers used for the growth of the carbon fibers). The deviation has a tendency to be more conspicuous as the region in which the carbon fibers are grown becomes wider. Moreover, even if the areas are the same, there is also a tendency to produce the deviation of the growth conditon of the carbon fibers (in particular pertaining to the film thicknesses).

Moreover, the problem is also caused similarly in case of the use of a depressurized thermal CVD (low-pressure thermal CVD) method. Even by the depressurized thermal CVD (low-pressure thermal CVD) method, it is difficult to decrease the deviations concerning the film thicknesses and the like of carbon fibers within a desired range.

As described above, in the case where the areas and the film thicknesses of carbon fibers depend on their arrangement pitches, the sizes of the substrates on which the carbon fibers are arranged, and the like, the necessity of changing manufacturing conditions of the carbon fibers is generated at every mass production of displays having various sizes and various kinds of resolution. As a result, a manufacturing cost increases. Moreover, the deviations of film thicknesses and the like results in a deterioration of the uniformity of display.

The present invention aims to provide a method for manufacturing carbon fibers which can decreases the deviation (unevenness) of film thicknesses and areas of respective carbon fibers in dependence on the numbers, the positions and the areas of the carbon fibers, and on the whole areas (the sizes of substrates) and the like. Furthermore, the present invention also aims to provide manufacturing methods severally capable of inexpensively providing an electron-emitting device and a light bulb, both using the carbon fibers manufactured by the above-mentioned manufacturing method as electron-emitting members, an electron source configured with the electron-emitting devices, an image-forming apparatus and a secondary battery using the carbon fibers as cathodes.

According to a first aspect of the present invention, there is provided a method for manufacturing carbon fibers by means of a thermal CVD method, the method including at least the step of heating a substrate including a catalyst layer arranged on a surface of the substrate in a depressurised atmosphere including a carbon containing gas to grow carbon fibers from the catalyst layer, wherein a partial pressure of the carbon containing gas is 1/1000 or less of a total pressure of the reduced pressure atmosphere, and is 10 Pa or less.

According to a second aspect of the present invention, there is provided a method for manufacturing carbon fibers by means of a thermal CVD method, the method including at least the step of heating a substrate including a catalyst layer arranged on a surface of the substrate in a depressurised atmosphere including a carbon containing gas to grow carbon fibers from the catalyst layer, wherein a total pressure of the reduced pressure atmosphere is 2000 Pa or less, and a partial pressure of the carbon containing gas is 10 Pa or less.

According to a third aspect of the present invention, there is provided a method for manufacturing carbon fibers by means of a thermal CVD method, the method including at least the step of heating a substrate including a catalyst layer arranged on a surface of the substrate in a depressurised atmosphere including a carbon containing gas to grow carbon fibers from the catalyst layer, wherein a total pressure of the reduced pressure atmosphere is 600 Pa or less, and a partial pressure of the carbon containing gas is 10 Pa or less.

According to a fourth aspect of the present invention, there is provided a method for manufacturing an electron-emitting device using carbon fibers as electron-emitting members, wherein the carbon fibers are manufactured by a manufacturing method according to the first to third aspect of the present invention.

According to a fifth aspect of the present invention, there is provided a method for manufacturing an electron source composed of a plurality of electron-emitting devices arranged on a substrate, wherein the-electron-emitting devices are manufactured by a manufacturing method according to the fourth aspect of the present invention.

According to a sixth aspect of the present invention, there is provided a method for manufacturing an image display apparatus including an electron source and an image-forming member arranged to be opposed to the electron source, wherein the electron source is manufactured by a manufacturing method according to the fifth aspect of the present invention.

According to a seventh aspect of the present invention, there is provided a method for manufacturing a light bulb including an electron-emitting body using carbon fibers as electron-emitting members, and a light-emitting member, wherein the carbon fibers are made by a manufacturing method according to the first aspect of the present invention.

According to an eighth aspect of the present invention, there is provided a method for manufacturing a secondary battery using carbon fibers as cathodes, wherein the carbon fibers are manufactured by a manufacturing method according to the first aspect of the present invention.

BRIEF DESCRIPTION OF THE DRAWINGS

FIGS. 2A, 2B, 2C1 and 2C2 are schematic views showing a structure of graphite nanofibers;

DETAILED DESCRIPTION OF THE PREFERRED EMBODIMENTS

In the following, examples of methods for manufacturing carbon fibers, an electron-emitting device, an electron source, an image-forming apparatus, a light bulb and a secondary battery according to the present invention will be severally described. Incidentally, the sizes, the qualities of the materials, the shapes, the relative positions, and the like of components to be described in the following do not mean to limit the scope of the present invention to those ones unless specially mentioned to the limitation. Similarly, the manufacturing processes to be described in the following are not the only ones.

Figure 1A:
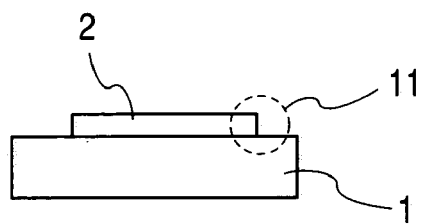
FIGS. 1A, 1B and 1C are schematic views showing a structure of carbon nanotubes.
Figure 1B:
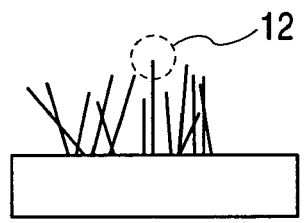
Figure 1C:
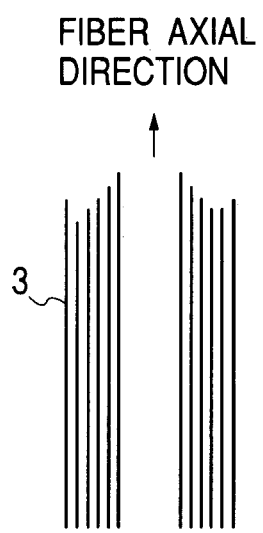
Figure 2A:
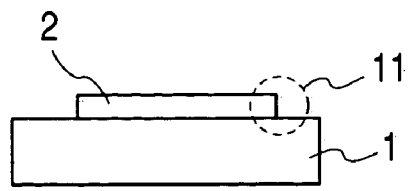
Figure 2B:
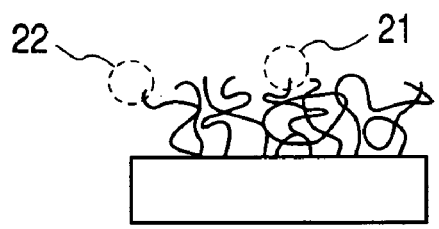
Figure 2B:
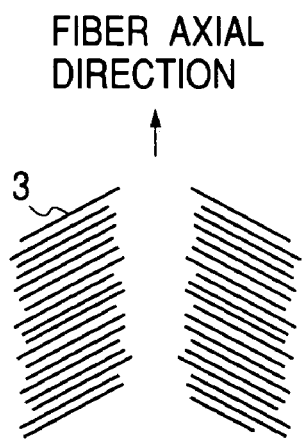
Figure 2B:
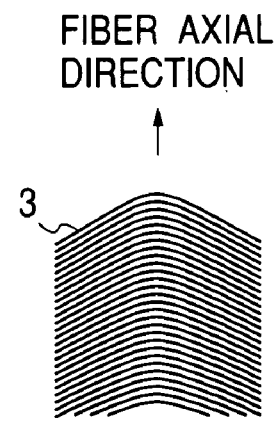

Carbon fibers, formed by decomposing a carbon containing gas such as a hydrocarbon gas by the thermal CVD method by the use of a catalyst, have several forms and names. FIGS. 1A–1C and 2A–2C2 schematically show examples of the forms of carbon fibers which can be manufactured by manufacturing methods of the present invention. In the drawings, a reference numeral 1 designates a substrate. A reference numeral 2 designates a "film including a plurality of carbon fibers" composed of a plurality of carbon fibers. A reference numeral 3 designates a graphen. Moreover, FIGS. 1A and 2A severally show a form which can be seen at an optical microscope level (up to about 1,000 magnifications). FIGS. 1B and 2B severally show a form which can be seen at a scanning electron microscope level (SEM) (up to about 30,000 magnifications). FIGS. 1B and 2B are magnified figures of parts 11 in FIGS. 1A and 2A, respectively. FIGS. 1C, 2C1 and 2C2 severally schematically show a form of a carbon fiber which can be seen at a transmission electron microscope (TEM) level (up to about 1,000,000 magnifications). FIG. 1C is a magnified figure of a carbon fiber 12 shown in FIG. 1B. FIGS. 2C1 and 2C2 are magnified figures of carbon fibers 21 and 22 shown in FIG. 2B, respectively.

Incidentally, the "film including a plurality of carbon fibers" in the present invention is an expression implying a plurality of carbon fibers which are regularly or randomly arranged with a space between each of them. Of course, a plurality of carbon fibers which are arranged to be intertwined with one another in a tight formation is included in the scope of the expression, "film including a plurality of carbon fibers". Thus, the "film including a plurality of carbon fibers" in the present invention also includes a group formed of a plurality of carbon fibers in some degree. Moreover, the "film including a plurality of carbon fibers" in the present invention sometimes includes an amorphous carbon material other than the carbon fibers and/or a catalyst used for growing the carbon fibers in addition to the carbon fibers.

A graphite is formed of stacked carbon planes with an interval of 3.354 Å ideally between each carbon plane formed by arranging regular hexagons as if they are spread out, each formed of carbon atoms bonded with each other by covalent bonding caused by sp2 hybridization. Each sheet of the carbon planes is called as a "graphen" or a "graphen sheet".

A graphen shaped in a cylinder as shown in FIG. 1C is called as a "carbon nanotube (CNT)". A carbon fiber composed of one cylindrical graphen (graphen cylinder) is called as a "single wall nanotube (SWNT)". Furthermore, a carbon fiber composed of many cylindrical graphens 3 in a telescopic state is called as a "multi-wall nanotube (MWNT)".

Some MWNT's have bamboo joint-like structures in their hollow structures. In many of them, the angles of the graphens at the outermost peripheries to the axes of the fibers are almost 0 degrees. Such structures are also included in the carbon nanotubes.

These carbon nanotubes are characterized in that their fiber axial directions and the surfaces of the graphens formed in cylinders on their outermost peripheries are almost parallel to each other (the angles formed by the axes of the fibers (in the lengthwise directions of the fibers) and the graphens are about zero degrees), and in that the insides of the tubes are always hollow.

On the other hand, carbon fibers which are produced at a relatively low temperature with a catalyst similarly to carbon nanotubes are shown in FIGS. 2A–2C2. The carbon fibers of this form are formed in a stacked body of graphens 3.

The forms of FIGS. 2A–2C2 take structures in which many (two or more) graphens 3 are stacked on one another in order that the surfaces of the stacked graphens 3 are not parallel to the axial directions (lengthwise directions) of the carbon fibers. In this specification, such carbon fibers are called as "graphite nanofiber (GNF)".

In the case where angles formed by the axis of a fiber and the surfaces of graphens are almost 90 degrees, such a fiber is called as a "platelet type" fiber. In other words, the "platelet type" fiber has a structure in which many graphen sheets are stacked as a pack of cards.

On the other hand, as shown in FIGS. 2C1 and 2C2, a form in which the angles of graphen sheet surfaces to the axis direction of a fiber is smaller than 90 degrees and larger than 0 degrees is called as a "herringbone" type. The "herringbone" type form includes a form formed by stacking holed bowl-like graphens (shown in FIG. 2C1). Moreover, a form like a stacked opened book facing downward (a form like a stacked graphens severally having a V-letter like shape) (shown in FIG. 2C2) is also included in the "herringbone" type form.

The portions in the vicinity of the centers of some of the herringbone type are hollow along the direction of the fiber axes, and the portions in the vicinity of the centers of some other herringbone type are filled with amorphous carbon (in which spots, and light and dark images of a distinct crystal lattice cannot be seen, and only a broad ring pattern or the like can be seen in an electron diffraction image at the TEM level).

FIG. 2B shows a schematic view of carbon fibers when the carbon fibers have grown in the sate in which their linearity is bad. Not all of the carbon fibers formed by the manufacturing method according to the present invention have such bad linearity, and it is possible to obtain the carbon fibers having good linearity.

The carbon nanotubes and the graphite nanofibers described above are preferably applied to an electron-emitting device from the viewpoint of electron-emitting characteristics. In particular, the graphite nanofibers are preferable because they can obtain a large emission current better than the carbon nanotubes. However, the present invention can applied to all of the carbon fibers formed by the depressurized thermal CVD (low-pressure thermal CVD) method as well as to the carbon nanotubes and to the graphite nanofibers. In this invention, "depressurized atmosphere" and "low-pressure atmosphere" mean an atmospheric pressure of less than 1 atm. Also, the carbon fiber in the present invention comprises carbon as its principal component and its length is at least ten times its diameter. A preferable diameter is from 1 nm to 500 nm, and more preferably from 5 nm to 100 nm in view of the electron emission stability.

The carbon nanotubes and the graphite nanofibers can be selectively manufactured by the kinds of catalysts and the temperatures of decomposition. It is also possible to control carbon fibers having both the structures selectively by a temperature. Moreover, it is further possible to form the "film including a plurality of carbon fibers" which has only one of the structures.

In the following, FIGS. 3A and 3B will be referred to while a preferable embodiment of the manufacturing method of the present invention is described.

(Step 1)

Figure 3A:
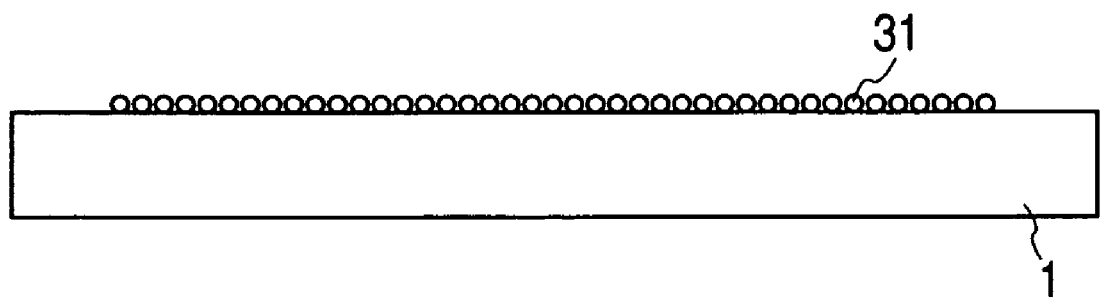
FIGS. 3A and 3B are views showing an example of the method for manufacturing carbon fibers according to the present invention.
Figure 3B:
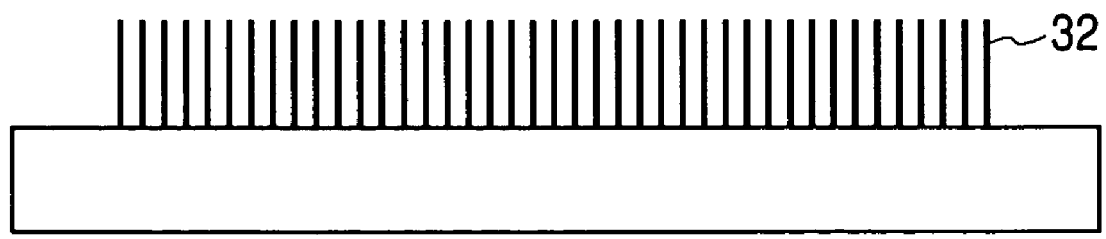

A catalyst layer 31 is formed on the substrate 1 (see FIG. 3A).

As the substrate 1 in the context of the present invention, an insulating substrate, such as quartz glass, soda lime glass, alkali free glass, low alkali glass, including a reduced content of an alkaline metals such as Na, and a high strain point glass for a plasma display panel (PDP) can be used. Alternatively, a conductive substrate, such as a strainless steel plate, can be used.

The catalyst layer 31 according to the present invention is preferably composed of a plurality of catalyst particles. To put it concretely, Fe, Ni, Co, Pd and their alloys can be preferably used as catalyst materials. In particular, an alloy of Pd and Co is preferably used for forming graphite nanofibers.

For example, the catalyst layer 31 may be formed by depositing one of the catalyst materials mentioned above on the substrate 1 to form a layer that is about several nanometers thick using a vacuum deposition apparatus, such as a spatter, and then heating the substrate 1 under a reducing atmosphere to agglomerate the catalyst material to form particles. Moreover, the catalyst layer 31 composed of catalyst particles can be obtained also by coating a metal complex solution containing one of the catalyst materials on the substrate 1, baking the substrate to eliminate the solution, and performing the reduction agglomeration treatment. Furthermore, the catalyst layer 31 composed of catalyst particles can be also obtained by preparing a liquid in which previously formed catalyst particles are dispersed in a dispersing medium, coating the liquid on the substrate 1, and drying the liquid to eliminate the dispersing medium.

Hereupon, an example in which the catalyst layer 31 is directly formed on the substrate 1 is described. However, when the carbon fibers are used for an electronic device such as an electron-emitting device, an electrode (conductive layer) is necessary to be arranged between the catalyst layer 31 and the substrate 1. Alternatively, even if the electrode for the electronic device is not used, there are some cases where an intermediate layer is disposed between the catalyst layer 31 and the substrate 1 for suppressing reactions between the substrate 1 and the catalyst layer 31.

As preferable materials as the intermediate layers having the characteristics mentioned above, nitrides of transition metals can be cited. As the nitrides of the transition metals, for example, TiN, ZrN, TaN, HfN, VN and CrN can be cited. Preferably, the intermediate layer is composed of a conductive film. Moreover, oxides such as TiOx can be used for the intermediate layer in case of being thin. Furthermore, by disposing such an intermediate layer between the electrode and the catalyst layer 31, a selection range of the materials of the electrode can be widened.

As described above, the arrangement relations between the substrate 1 and the catalyst, and the members to be disposed between the catalyst and the substrate 1 are changeable according to devices to be suitably used.

(Step 2)

Next, the substrate 1 including the catalyst layer 31 is arranged in a reduced pressure(low pressure) atmosphere including a carbon containing gas, and the substrate 1 is heated. Thereby, a film 32 including a plurality of carbon fibers, which film is formed of a plurality of carbon fibers, is grown in the region where the catalyst layer 31 was disposed (see FIG. 3B).

Figure 4:
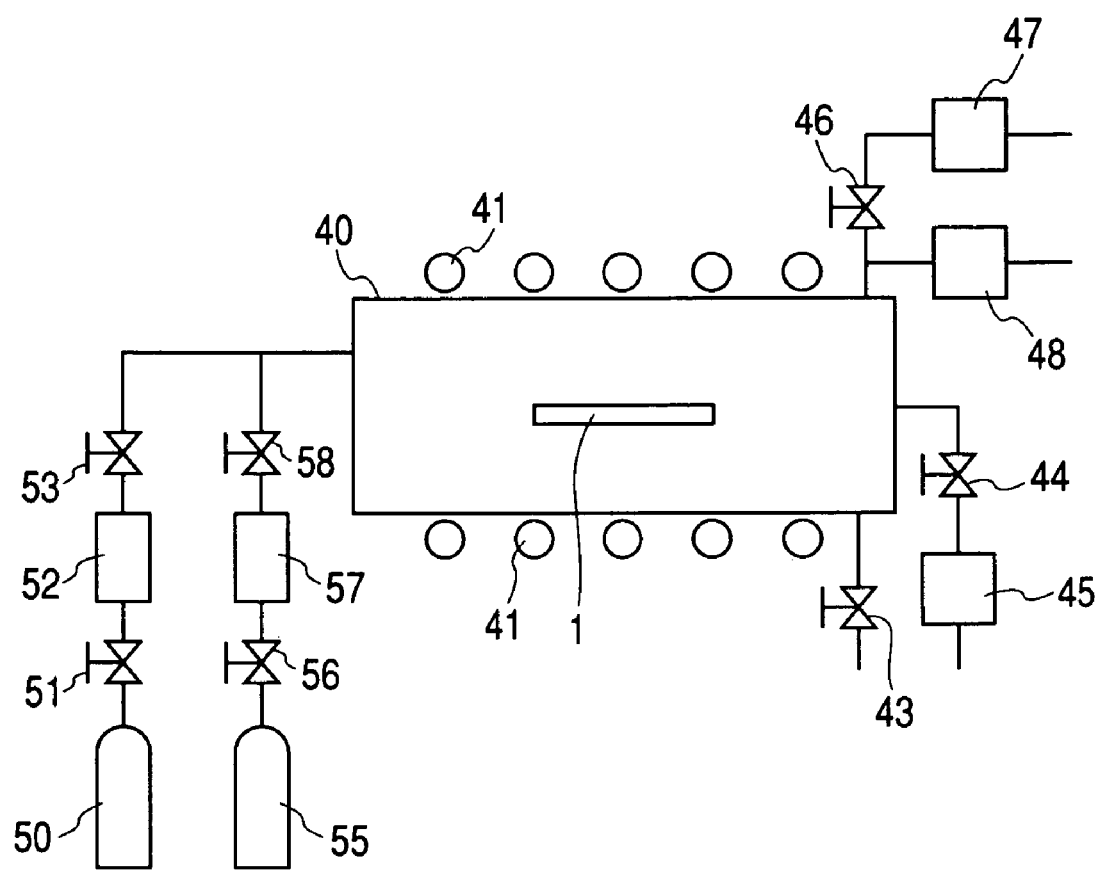
FIG. 4 is a view showing an example of a thermal CVD apparatus to be used for the present invention.

FIG. 4 shows an example of a thermal CVD apparatus for manufacturing the carbon fibers to be used for the present invention. In FIG. 4, a reference numeral 40 designates a reaction container. A reference numeral 41 designates a heat source such as an infrared lamp or a heating coil. The reference numeral 1 designates the substrate on which the catalyst layer 31, obtained by the step 1 described above, is disposed. A reference numeral 43 designates a leak valve. Reference numerals 44, 46, 51, 53, 56 and 58 designate valves. A reference numeral,45 designates a vacuum pumping apparatus such as a turbo-molecular pump. A reference numeral 47 designates a quadrupole mass spectrometer for analyzing a gas composition in the reaction container 40 and for measuring partial pressures of the gas compositions. A reference numeral 48 designates Baratron (registered trademark) vacuum gage for measuring the whole pressure in the reaction container 40. A reference numeral 50 designates a container (cylinder) of the carbon containing gas mentioned above. A reference numeral 55 designates a container of a carrier gas. Reference numerals 52 and 57 severally designate a control apparatus called as a mass flow controller for introducing a fixed quantity of a gas.

As the carbon containing gas used in the present invention, for example, a hydrocarbon gas such as an acetylene gas, an ethylene gas, a methane gas, a propane gas and a propylene gas; and an organic solvent gas such as a-carbon monoxide gas, an ethanol gas and an acetone gas can be used. Among them, the hydrocarbon gas is preferably used, and in particular the acetylene gas is preferably used.

Moreover, in the present invention, it is preferable to introduce the carbon containing gas into the reduced pressure atmosphere (into the reaction container 40) in the state of being mixed with the carrier gas. As the carrier gas, an inactive (inert) gas such as a helium gas and an argon gas is used. Moreover, there are some cases where a hydrogen gas or a nitrogen gas is introduced into the reduced pressure atmosphere in addition. In particular, the reducing gas such as the hydrogen gas is preferably used.

The procedure of this step can be performed, for example, as follows.

(Step 2-1)

The substrate 1 obtained at the step 1 mentioned above is disposed in the reaction container 40.

(Step 2-2)

The valve 44 is opened. The inside of the reaction container 40 is exhausted up to about $1 \times 10^{-4}$ Pa with the vacuum pumping apparatus 45.

(Step 2-3)

The valves 51, 53, 56 and 58 are opened. The quantity of flow of the carbon containing gas described above is controlled with the mass flow controller 52, and the quantity of flow of the carrier gas is controlled with the mass flow controller 57. Thereby, the quantities of flow of the gases and the conductance of the valve 44 are suitably adjusted in order that the total pressure in the inside of the reaction controller 40 may be a desired pressure.

The partial pressure of the carbon containing gas in the reaction container 40 is controlled so as to be 10 Pa or less. By controlling the partial pressure to be within such a pressure range, the deviation (unevenness) of the film thicknesses of the carbon fibers can be suppressed. Moreover, when the partial pressure of the-carbon containing gas in the reaction container 40 is 1 Pa or less, a further decrease of the degree of the deviation (unevenness) can be realized.

Moreover, the total pressure in the reaction container 40 is kept to be the reduced pressure atmosphere. That is, the depressurized (low pressure) thermal CVD method is performed. Preferably, the total pressure is made to be 2000 Pa or less, and thereby a further effect of the decrease of the deviation (unevenness) can be obtained in addition to the effect owing to the partial pressure of the carbon containing gas. Moreover, by performing the depressurized (low pressure) thermal CVD method under the condition of the total pressure in the reaction container 40 being 600 Pa or less, the best effect can be obtained.

Moreover, in the present invention, it is preferable that the partial pressure of the carbon containing gas is 1/1000 or less to the total pressure in the reaction container 40.

(Step 2-4)

Next, while keeping the conditions of the partial pressure and the total pressure at the Step 2-3 mentioned above, the electric power thrown to the heat source 41 is adjusted, and the temperature of the substrate 1 is adjusted to be a fixed temperature (constant temperature) within a range of from 350° C. to 800° C. Thereby, carbon fibers are grown.

By performing the steps described above, the carbon fibers having a film thickness the deviation (unevenness) of which is greatly reduced can be manufactured without depending on the size of the substrate 1, the size (area) of the catalyst layer 31, arrangement pitches and the like greatly.

Moreover, in the apparatus shown in FIG. 4 described above, the total pressure in the container 40 and the partial pressure of the carbon containing gas can be examined, for example, as follows.

Because the quadrupole mass spectrometer 47 can operate only under a high vacuum (higher vacuum than $1 \times 10^{-3}$ Pa), the present apparatus is provided with a differential exhaust system. Thereby, a micro quantity gas in a low vacuum (high pressure) is introduced into the high vacuum, and the components (atomic weights) and the intensity (ionizing current) are measured. A reduced partial pressure of the measured ionizing current can be calculated by performing the sensitivity adjustment thereof and the isotopic adjustment thereof (adjustment on a different atomic structure having the same mass). Even if the differential exhausting is performed for analysis in such a system, the gas composition and the composition ratio at the time of a high pressure do not change.

Based on the aforesaid facts of the partial pressure, the total sum of the partial pressures such as of the partial pressure of the carrier gas, the partial pressure of the carbon containing gas, the partial pressure of a micro quantity of water, and the like in the reaction container 40 is the same as the above total pressure, then actual partial pressures in the reaction container 40 can be obtained. Moreover, the total pressure mentioned above can be measured with the Baratron vacuum gage 48 mentioned above.

Moreover, at the Step 2-4, when the partial pressure of the carbon containing gas is measured with the quadrupole mass spectrometer 47 in the state of growing the carbon fibers, there are some cases where the partial pressure of the carbon containing gas decreases in comparison with the case where the carbon fibers are not grown (a case where the catalyst layer 31 is not disposed, or a state in which, though the catalyst layer 31 is disposed, the temperature of the substrate 1 is a room temperature and the growth of the carbon fibers does not start at all). Hereupon, the fact that the partial pressure of the carbon containing gas decreases means that the carbon-containing gas has been converted to the carbon fibers in the reaction container 40).

The degree of the decrease of the partial pressure of the carbon containing gas is determined on the basis of the introduced quantity of the carbon containing gas and the quantity of the grown carbon fibers.

Hereupon, when, in the partial pressures of the carbon containing gas to be measured with the quadrupole mass spectrometer 47, a partial pressure in the case where the catalyst layer 31 is not disposed (or in the case where, though the catalyst layer 31 is disposed, the temperature of the substrate 1 is a room temperature and the growth of the carbon fibers are not started at all) is designated by a reference mark Pn, and when the partial pressure in the case where the catalyst layer 31 is disposed and the carbon fibers are grown is designated by a reference mark Pg, the "partial pressure of the carbon containing gas" mentioned in the present invention is defined as the same meaning as that of the aforesaid partial pressure Pn.

The consumption efficiency of the carbon containing gas can be expressed as: (Pn−Pg)×100/Pn. By increasing the consumption efficiency of the carbon containing gas (the conversion efficiency thereof to the carbon fibers) furthermore, the yield at the time of manufacturing the carbon fibers from the carbon containing gas is improved, and a reduction in costs is lead.

In the following, FIGS. 5 and 6 will be referred to while the "deviation (unevenness)" of carbon fibers in the present invention is described.

Figure 5:
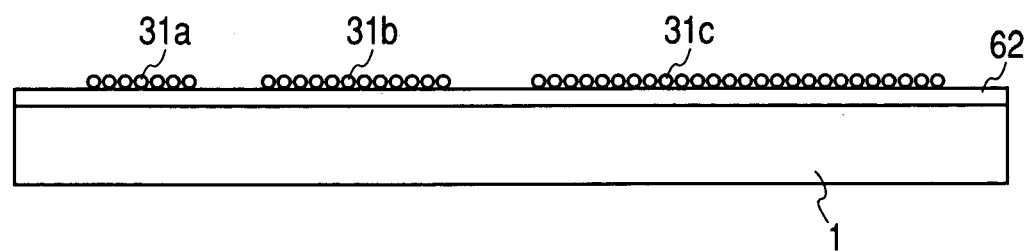
FIG. 5 is an explanatory view showing dispersion of carbon fibers.
Figure 6:
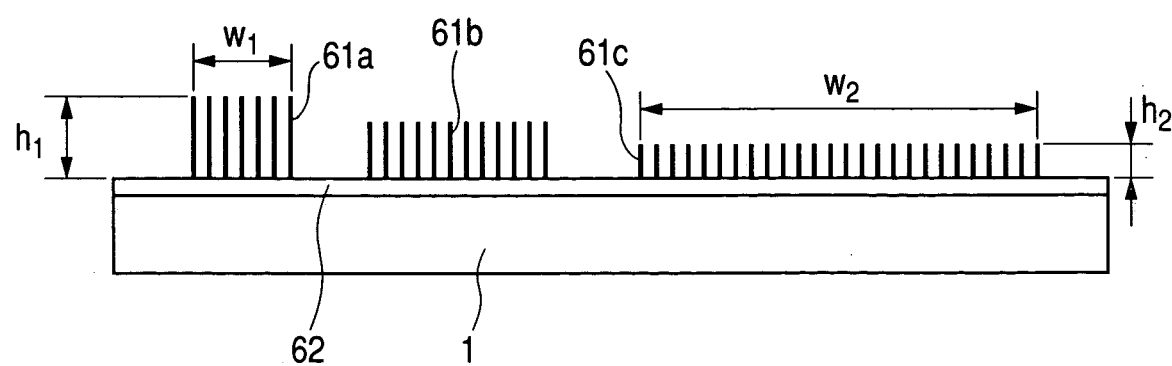
FIG. 6 is another explanatory view showing dispersion of carbon fibers.

FIG. 6 is a view showing a state in which carbon fibers 61a–61c have been grown by the thermal CVD method after forming catalyst layers 31a–31c, respectively, having different areas on the same substrate 1 as shown in FIG. 5. Incidentally, a reference numeral 62 in FIG. 6 designates the aforesaid intermediate layer provided for suppressing reactions between the catalysts and the substrate 1.

In FIG. 6, a formation width of carbon fibers ("a film including carbon fibers") 61a having the minimum formation width (about several μm) formed by the thermal CVD method is designated by a reference mark W1, and the film thickness of the carbon fibers 61a is designated by a reference mark h1. Moreover, a formation width of carbon fibers ("a film including carbon fibers") 61c having the maximum formation width (about several mm) is designated by a reference mark W2, and the film thickness of the carbon fibers 61c is designated by a reference mark h2. In this case, an absolute value of a difference between the maximum film thickness h1 and the minimum film thickness h2 is determined at an arbitrary positions in the minimum formation width W1 and the maximum formation width W2, and then dispersion S is defined as a percentage of the absolute value to the minimum film thickness h2. That is, the dispersion S is expressed by the following formula.

$$S(\%) = \{|h1 - h2|/h2\} \times 100$$

Incidentally, the film thicknesses h1 and h2 of the carbon fibers can be defined as average values of heights obtained by connecting the tips of respective fibers (at positions farthest from the surface of the intermediate layer 62) in the films including the carbon fibers for including 80% or more of the carbon fibers in respective regions.

Figure 7A:
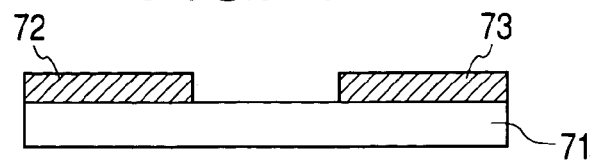
FIGS. 7A, 7B, 7C, 7D and 7E are process drawings of a method for manufacturing an electron-emitting device according to the present invention.
Figure 7B:
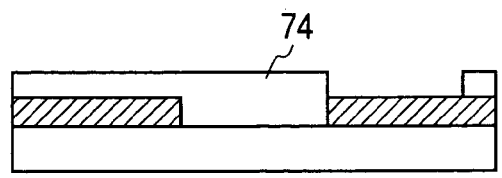
Figure 7C:
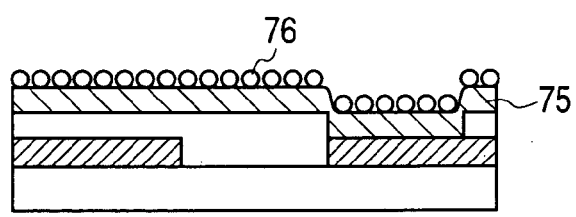
Figure 7D:
Figure 7E:
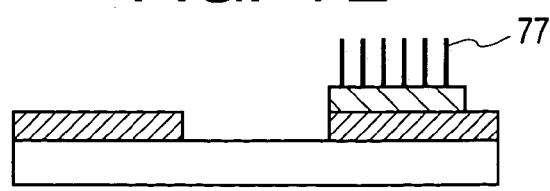
Figure 8A:
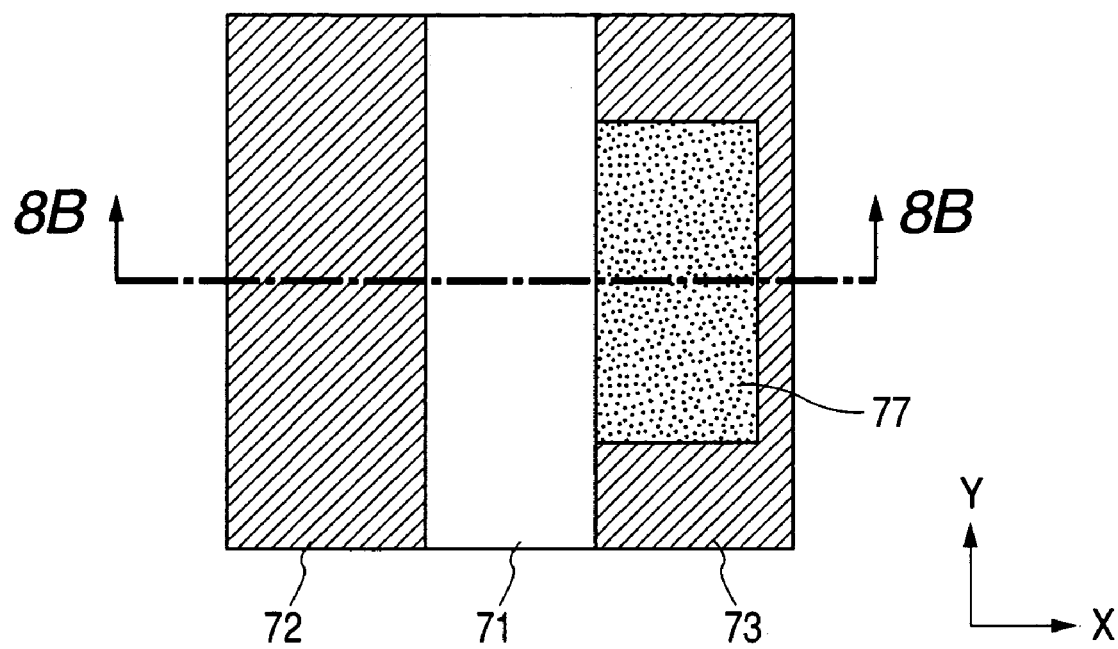
FIGS. 8A and 8B are views showing an example of the electron-emitting device obtained by the process shown in FIGS. 7A–7E.
Figure 8B:
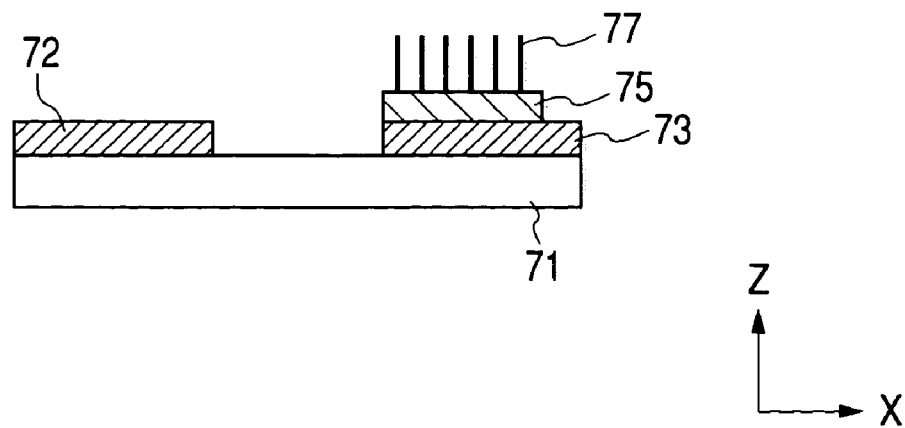

In the following, FIGS. 7A–7E will be referred to while an example of manufacturing processes of an electron-emitting device shown in FIGS. 8A and 8B is described.

FIGS. 8A and 8B are schematic diagrams showing an example of the structure of the electron-emitting device obtained by the present invention. FIG. 8A is a plan view. FIG. 8B is a sectional view taken along a line 8B—8B in FIG. 8A. Moreover, FIGS. 7A–7E are views showing manufacturing processes of the electron-emitting device of FIGS. 8A and 8B. FIGS. 7A–7E correspond to the 8B—8B cross section of FIG. 8A.

Figure 16:
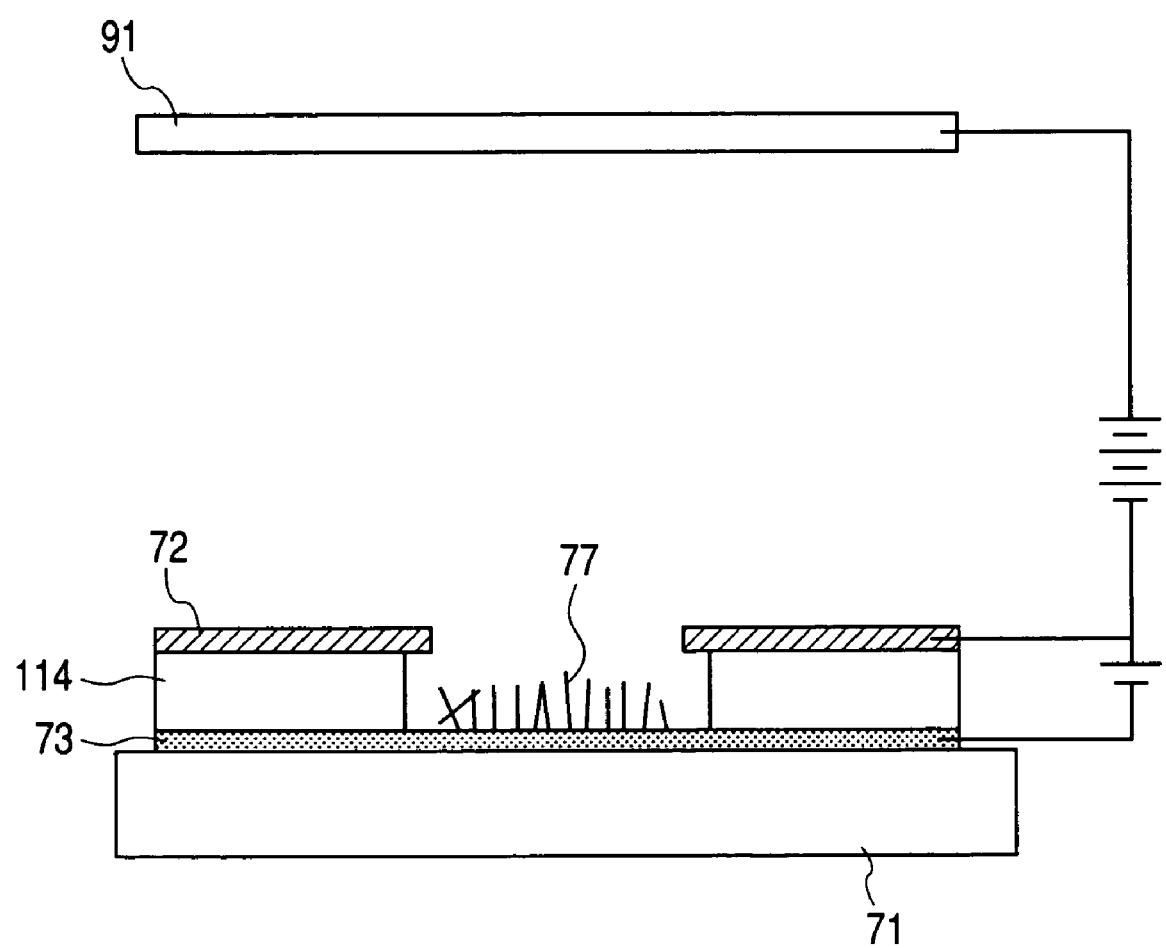
FIG. 16 is a schematic view showing an example of the form of another electron-emitting device to which the present invention can be applied.

Incidentally, hereupon, an example of a lateral type electron-emitting device as shown in FIGS. 8A and 8B will be described. However, the present invention can be applied to the so-called vertical type electron-emitting device as shown in FIG. 16. Incidentally, the lateral type electron-emitting device can be easily manufactured and has less capacitance component at the time of drive in comparison with the vertical type electron-emitting device. Consequently, the lateral type electron-emitting device can be driven at a high speed, and then the lateral type electron-emitting device is a preferable form.

Moreover, the "lateral type electron-emitting device" is an electron-emitting device in which an electric field is formed in a direction substantially parallel to the surface of the substrate and electrons are drawn from the film including the carbon fibers by the electric field. On the other hand, the "vertical type electron-emitting device" is an electron-emitting device in which an electric field is formed in a direction substantially perpendicular to the surface of the substrate and electrons are drawn from the film including the carbon fibers by the electric field. The so-called Spindt type electron-emitting device is included in the vertical type electron-emitting device.

Moreover, the vertical type electron-emitting device shown in FIG. 16 includes a cathode electrode 73 and a control electrode 72 (which structure is called as a triode (three terminal) structure by including an anode electrode 91). Because a film 77 including carbon fibers can emit electrons at a low electric field strength, the present invention can be applied to a vertical type electron-emitting device having a structure in which the control electrode 72 and insulating layers 114 are removed from the structure shown in FIG. 16. That is, the present invention can be also applied to the electron-emitting device composed of the cathode electrode 73 disposed on a substrate 71 and the film 77 including carbon fibers arranged on the cathode electrode 73 (which structure is called as a diode (two terminal) structure by including the anode electrode 91).

Moreover, in the triode structure mentioned above, as shown in FIG. 16, there is a case where the control electrode 72 functions as the so-called gate electrode (an electrode for drawing electrons from the film 77 including carbon fibers). Because the film 77 including carbon fibers can emit electrons at a low electric field strength, there are some cases where the drawing (extracting) of electrons from the film 77 including carbon fibers is performed by the anode electrode 91, and where the control electrode 72 may be used for performing the modulation of the electron emission quantity from the film 77 including carbon fibers, a stop of electron emission, or shaping, such as the convergence of an electron beam to be emitted.

The examples which will be described in the following are only examples, and the manufacturing methods according to the present invention are not limited to the following examples.

In FIGS. 7A–7E and 8A–8B, reference numeral 71 designates the insulating substrate. Reference numeral 72 designates the control electrode. Reference numeral 73 designates the cathode electrode. Reference numeral 74 designates a resist pattern. Reference numeral 75 designates a conductive material layer. Reference numeral 76 designates a catalyst layer. Reference numeral 77 designates the film including a plurality of carbon fibers, which is an emitter material.

As the insulating substrate 71, electrically insulation substrate, such as quartz glass described in FIG. 3, can be used. The surfaces of the substrate materials are sufficiently washed to be used.

The control electrode 72 and the cathode electrode 73 are electrically conductive and are formed by a general film formation technique, such as a vacuum deposition method and a sputtering method, a photolithography technique and the like. Preferably, the electrode materials are thermostable, such as carbon, a metal, a metal nitride, and a metal carbide.

The film 77 including a plurality of carbon fibers being an emitter material is formed of carbon nanotubes, graphite nanotubes or the like which have been grown by the use of the catalyst layer 76.

In the following, every step will be described.

(Step 1)

After the substrate 71 is sufficiently washed, an electrode layer (not shown) is first formed on the entire substrate 71 for forming the control electrode 72 and the cathode electrode 73.

Next, in a photolithography step, a resist pattern is formed by the use of a positive type photoresist (not shown), and dry etching is performed by the use of the patterned photoresist mentioned above as a mask to form an electrode gap (an interval of a gap between the control electrode and the cathode electrode) of several microns (for example, 5 μm). Thus, the control electrode 72 and the cathode electrode 73 are patterned (see FIG. 7A).

Hereinafter, the patterning of a thin film or a resist by the photolithography process, film formation, lift-off, etching and the like are simply referred to as "patterning".

(Step 2)

At a photolithography process, a resist pattern 74 is formed by the use of a negative type photoresist to be used for lift-off of an upper layer at a later step (see FIG. 7B).

Next, the conductive material layer 75 as the intermediate layer which has been described before is formed. Then, by coating, for example, a dispersion liquid including a catalyst particles on the conductive material layer 75 and by drying the dispersion liquid, the catalyst layer 76 composed of catalyst particles is disposed on the conductive material layer 75.

(Step 3)

An etchant of the resist patterned at the Step 2 is used for lifting off the conductive material layer 75 and the catalyst layer 76 on the resist pattern 74 together with the resist pattern 74. Thus, the patterns of the conductive material layer 75 and the catalyst layer 76 are formed in desired regions (see FIG. 7D).

(Step 4)

Successively, similarly to the Step 2 of the method for manufacturing carbon fibers, which has been described before, (FIG. 3B), the substrate 71 is heated under a depressurized atmosphere including a carbon containing gas to grow the film 77 including a plurality of carbon fibers by the low-pressure thermal CVD method (see FIG. 7E).

The electron-emitting device including the carbon fibers 77 formed as described above will be described by further using FIGS. 9 and 10.

Figure 9:
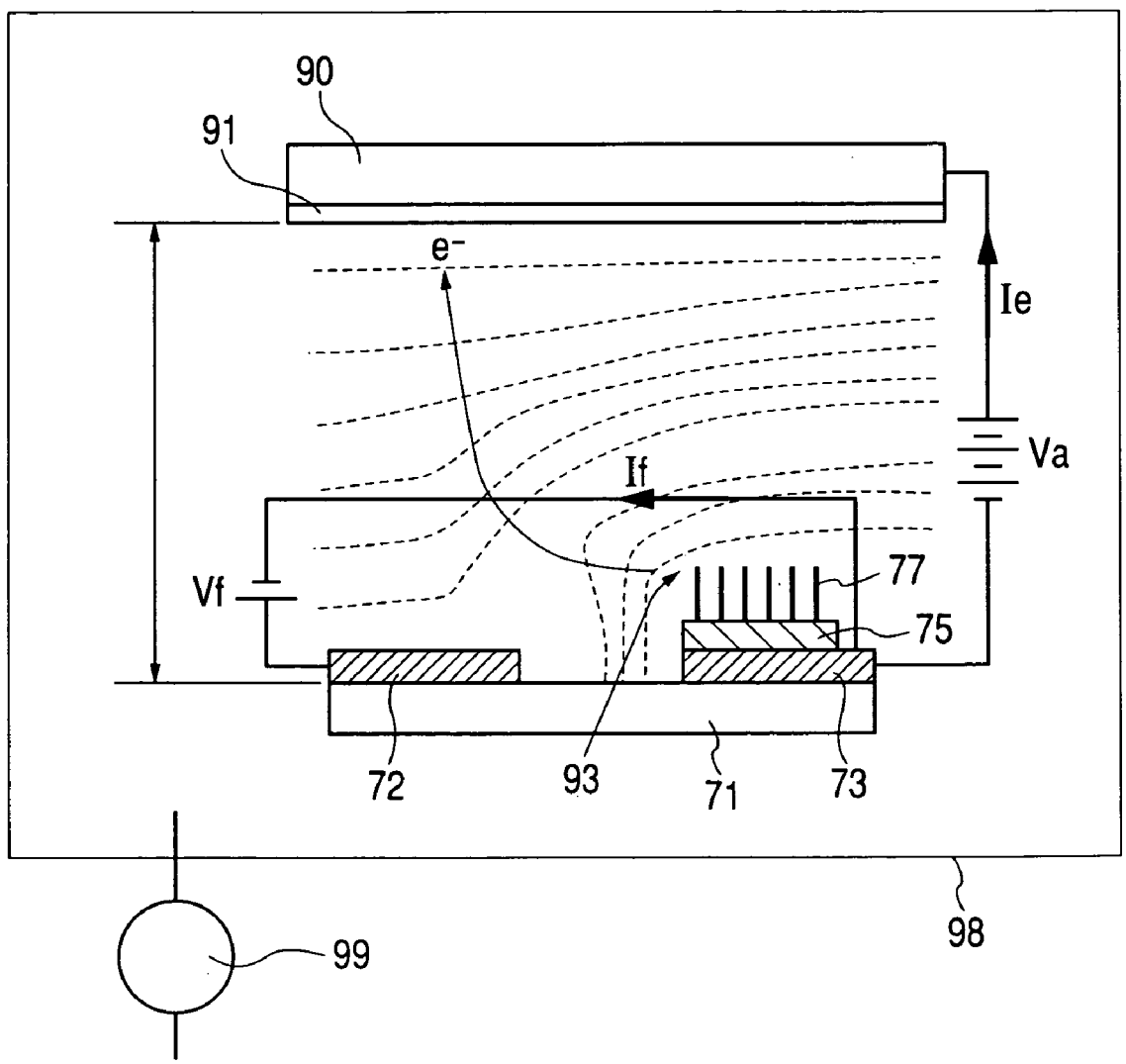
FIG. 9 is a view showing an example of a configuration for operating an electron-emitting device according to the present invention.

An electron-emitting device, in which the control electrode (gate electrode) 72 and the cathode electrode 73 are separated by a several micron electrode gap, is set in a vacuum apparatus 98, as shown in FIG. 9. The inside of the vacuum apparatus 98 is then exhausted until the inside pressure becomes about $10^{-4}$ Pa by a vacuum exhaust apparatus 99. An anode 90 is set at a position that is several millimeters higher than the substrate 71, and a high voltage Va of a several kilovolts is applied to the anode 90 by means of a high voltage power source. Incidentally, a phosphor 91 covered by a conductive film is attached to the anode 90.

A pulse voltage of about several tens volts is applied to the electron-emitting device as its drive voltage Vf, and a device current If flowing through the electron-emitting device and an electron emission current Ie were measured.

Equipotential lines at this time were formed as shown by broken lines in FIG. 9. The most concentrated point 93 of the electric field at which the electric field is most concentrated is supposed to be a position of the film 77 including a plurality of carbon fibers, which is the electron-emitting material. The position is nearest to the anode 90 and is nearest to inside of the electrode gap. It can be considered that electrons are emitted from the position.

Figure 10:
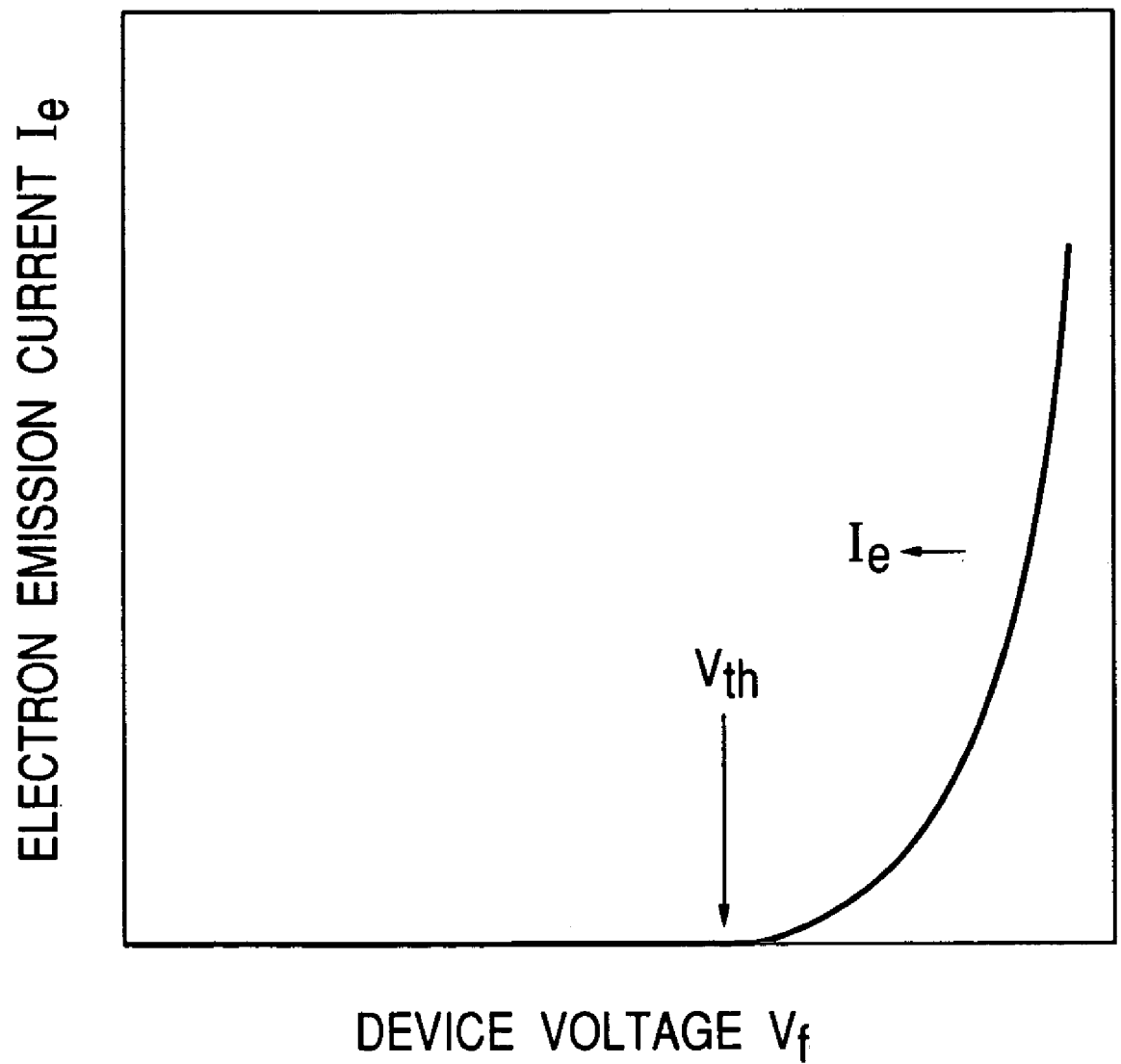
FIG. 10 is a view showing an operation characteristic of the electron-emitting device according to the present invention.

A characteristic of the electron emission current Ie of the electron-emitting device of the present invention is one as shown in FIG. 10. That is, when the drive voltage Vf is increased, the electron emission current Ie steeply rises, and the device current If (not shown in FIG. 10) behaves similarly to the characteristic of the electron emission current Ie. However, the values of the device current If is sufficiently smaller than those of the electron emission current Ie.

In the following, FIG. 11 will be referred to while an electron source including a plurality of electron-emitting devices obtained by the present invention is described on the basis of the aforesaid principle.

Figure 11:
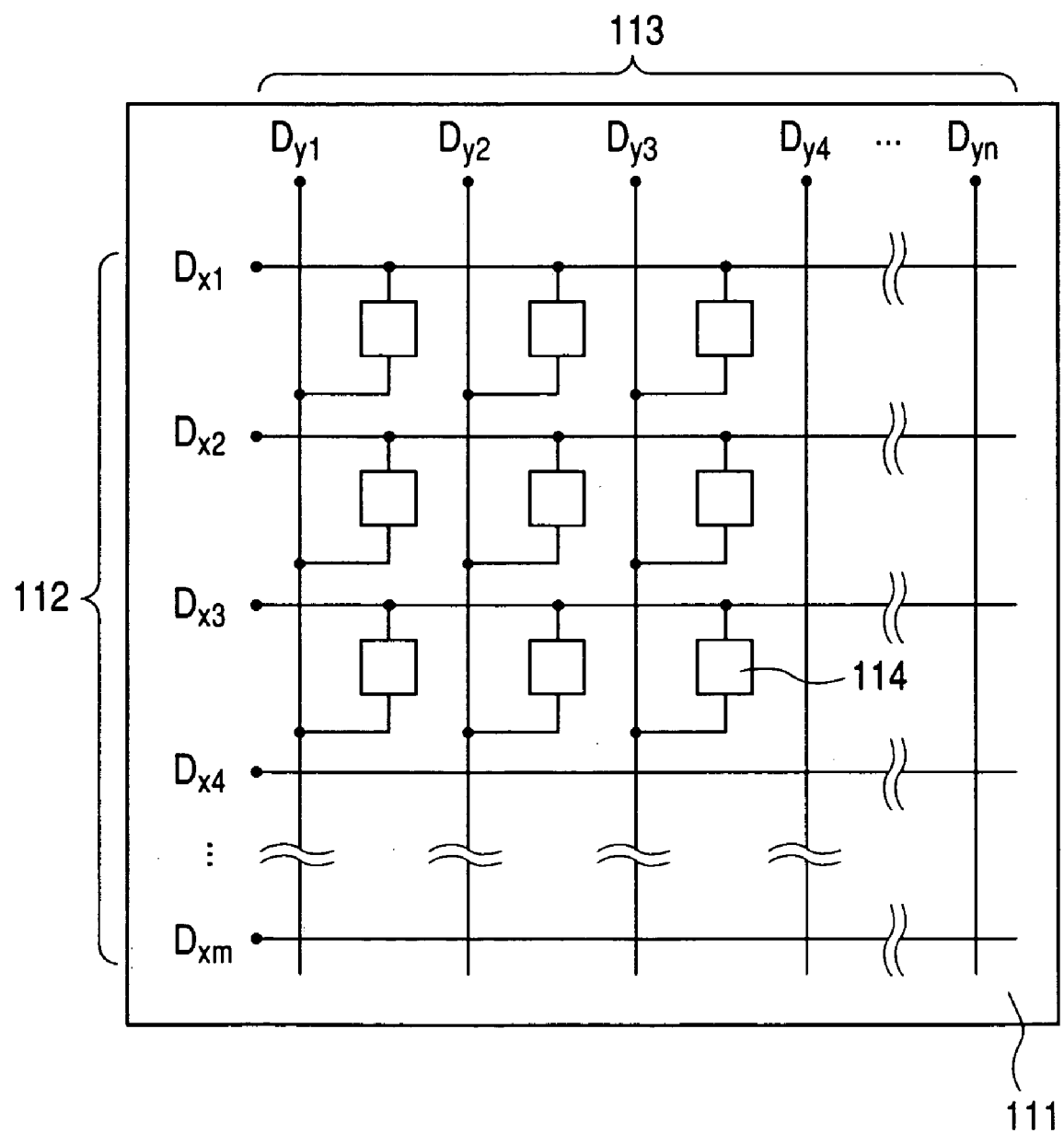
FIG. 11 is a view showing an example of an electron source according to the present invention.

In FIG. 11, a reference numeral 111 designates an electron source substrate. A reference numeral 112 designates X-direction wiring. A reference numeral 113 designates Y-direction wiring. A reference numeral 114 designates an electron-emitting device obtained by the present invention.

In FIG. 11, m pieces of the X-direction wiring 112 are composed of Dx1, Dx2, . . . , Dxm. The material, the thickness and the width of the wiring 112 are suitably designed. N pieces of the Y-direction wiring 113 are composed of Dy1, Dy2, . . . , Dym. The Y-direction wiring 113 is also formed similarly to the X-direction wiring 112. A not shown interlayer insulating layer is provided between the m pieces of the X-direction wiring 112 and the n pieces of the Y-direction wiring 113 for electrically insulating the wirings 112 and 113. (Both of the m and the n are positive integers.)

The X-direction wiring 112 and the Y-direction wiring 113 are pulled out as their respective external terminals.

A couple of electrodes (not shown) constituting the electron-emitting device 114 obtained by the present invention is electrically connected to the m pieces of the X-direction wiring 112 and the n pieces of the Y-direction wiring 113.

For example, not shown scanning signal applying means for applying a scanning signal for selecting a row of the electron-emitting devices 114 arranged in an X-direction is connected to the X-direction wiring 112. On the other hand, a not shown modulation signal generating means for modulating each column of the electron-emitting devices 114 arranged in Y-directions according to an input signal is connected to the Y-directional wiring 113. Thereby, an individual electron-emitting device 114 can be selected and driven independently.

Figure 12:
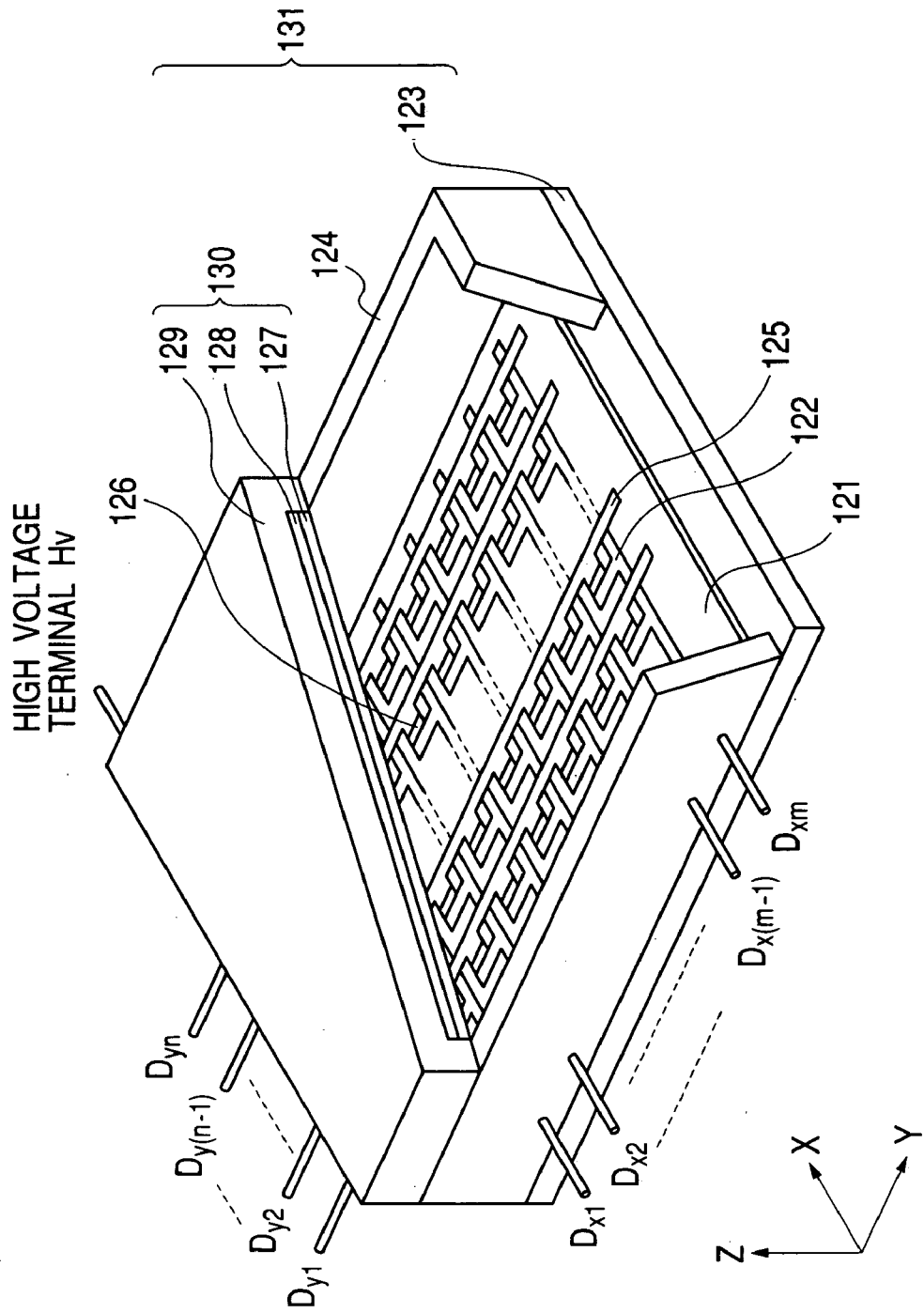
FIG. 12 is a view showing an example of an image-forming apparatus configured to use the electron source of FIG. 11.

FIG. 12 will be referred to while an image-forming apparatus composed of such an electron source in a simple matrix arrangement is described.

In FIG. 12, a reference numeral 121 designates an electron source substrate on which a plurality of electron-emitting devices is arranged. A reference numeral 123 designates a rear plate on which the electron source substrate 121 is fixed. A reference numeral 130 designates a face plate composed of a glass substrate 129 having an inner surface on which a phosphor film 128, a metal back 127 and the like are formed. A reference numeral 124 designates a supporting frame joined to the rear plate 123 and the face plate 130. A reference numeral 131 designates an envelope composed of the face plate 130, the supporting frame 124 and the rear plate 123 which are attached to one another to be sealed.

A reference numeral 126 designates an electron-emitting device obtained by the present invention. Reference numerals 122 and 125 designate X-direction wiring and Y-direction wiring, respectively, connected to the electron-emitting devices 126.

The envelope 131 is, as mentioned above, composed of the face plate 130, the supporting frame 124 and the rear plate 123. On the other hand, by providing a not shown supporting body called as a spacer between the face plate 130 and the rear plate 123, an envelope 131 having a sufficient strength to the atmospheric pressure can be configured.

The configuration of the image-forming apparatus mentioned above is an example of the image-forming apparatus obtained by the present invention, and various variations thereof can be adopted on the basis of the technical idea of the present invention. As an input signal, not only ones in accordance with the National Television Standards Code (NTSC) system, the Phase Alternation by Line (PAL) system, the sequential couleur a memoir (SECAM) system, and the like, but also ones in-accordance with a television (TV) signal system having more scanning lines than those systems mentioned above (for example, a high definition television system such as the multiple sub-nyquist sampling encoding (MUSE) system) can be adopted. Moreover, the image-forming apparatus obtained by the present invention can be used not only as a display apparatus of a television broadcast, a display apparatus for a television meeting system and a computer, but also as an optical printer composed of a photosensitive drum and the like, and the like.

Figure 13:
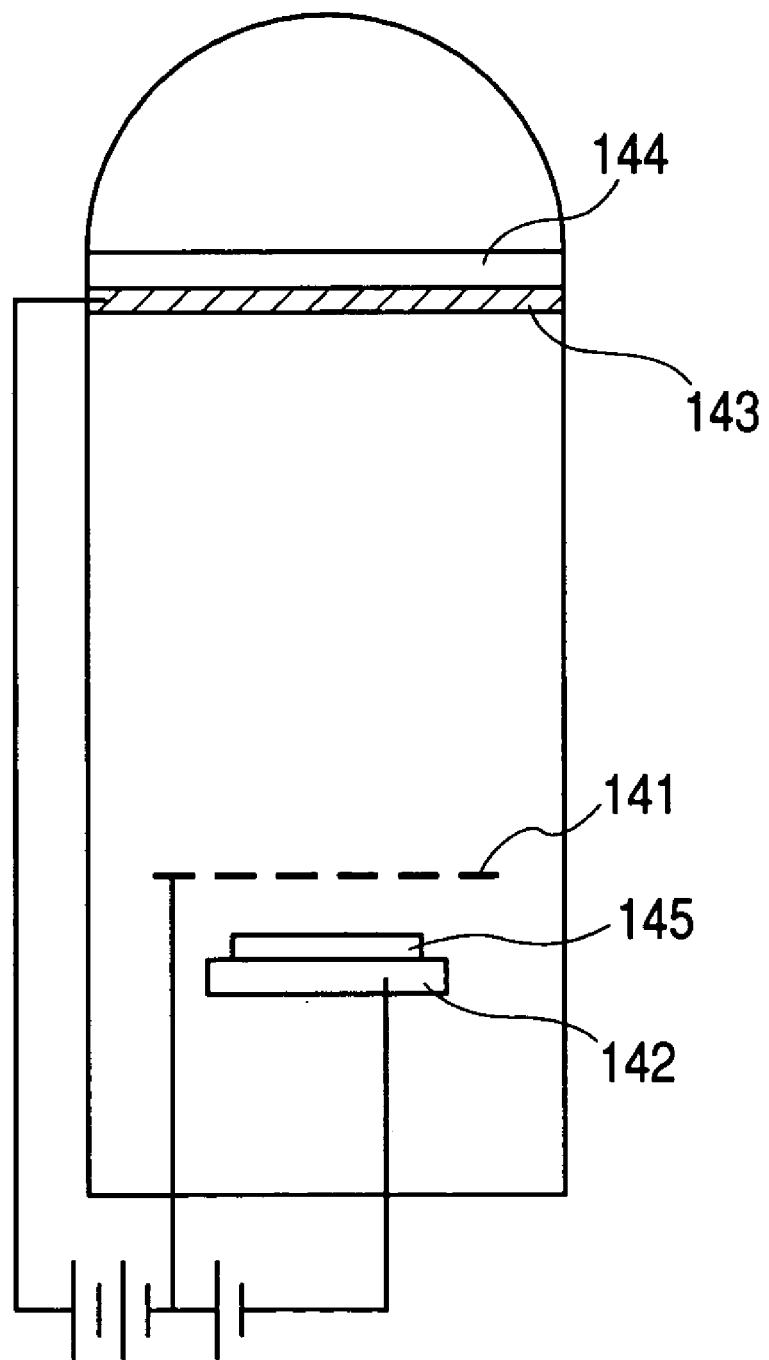
FIG. 13 is a schematic view showing an example of a light bulb according to the present invention.

Next, FIG. 13 will be referred to while a light bulb using a film including a plurality of carbon fibers according to the present invention as electron-emitting members is described. In FIG. 13, a reference numeral 141 designates a grid electrode having a role of drawing (extracting) electrons from a film 145 including a plurality of carbon fibers. The film 145 including the plurality of carbon fibers is manufactured by the method for manufacturing carbon fibers which has been described above and accords with the present invention. A reference numeral 142 designates a cathode electrode for supplying electrons to the film 145 including the plurality of carbon fibers. The cathode electrode 142 and the film 145 including the plurality of carbon fibers constitute an electron-emitting body. A reference numeral 143 designates an anode electrode made from aluminum. A reference numeral 144 designates a phosphor emitting a desired color of light. The anode electrode 143 and the phosphor 144 constitute a light-emitting member.

As another application example of the carbon fibers obtained by the manufacturing method of the present invention, an electrode material of a battery (cathode material) can be cited.

A graphite can store alkaline ions having small ion diameters such as Li ions between stacked graphens. By using the characteristic, a secondary battery of Li ions can be made. The property of the battery having such a form is determined on the basis of a storage ion quantity per unit volume. The graphite nanofibers (preferably "herringbone" type and the "platelet" type )described above especially have structures easy for storing ions, and consequently larger electric power can be taken out from a secondary battery using the graphite nanofibers.

Moreover, by making the diameters of fibers smaller to increase the density of the fibers, the surface area of the fibers can be increased.

Because the carbon fibers are chemically stable, a capacitor having larger capacitance than that of conventional ones can be manufactured by using the carbon fibers as an electrode material of the capacitor.

Moreover, some carbon nanotubes and graphite nanofibers have the structures in which the central parts of the fibers are hollow. The hollow structures can store hydrogen atoms therein. Consequently, the fibers of such kinds can be used as materials lighter in weight and capable of storing extensive hydrogen. Accordingly, the fibers of such kinds can be preferably applied.

EXAMPLES

In the following, examples of the present invention will be described in detail.

Example 1

In the present example, the formation areas of the catalyst layers were changed, and a plurality of carbon fibers was grown in each region. In the following, the manufacturing processes of a substrate including the attached catalyst layers will be described.

(Step 1)

In the present embodiment, a quartz substrate was used as the substrate 1. In the present example, an intermediate layer made of TiN having a thickness of 200 nm was formed on the substrate 1, because electrical connection means with the carbon fibers was necessary for evaluating electron emission characteristics.

(Step 2)

Rates and conditions of a sputtering target were adjusted in order that Co might be included in Pd by about 50 atomic percent, and then a Pd—Co alloy layer was formed.

(Step 3)

By the use of a photoresist, a plurality of resist patterns having widths changed within a range in which the minimum width was 5 µm, the maximum width was 10 mm, and the lengths in the depth direction were commonly 1 mm was formed. Then, the Pd—Co alloy layer was patterned by performing dry etching by an Ar gas having a pressure of several Pa. After the completion of the etching, the photoresist was peeled off.

(Step 4)

The substrate on which the catalyst layers were formed was disposed in the reaction container 40 of the thermal CVD apparatus shown in FIG. 4, and the gases in the reaction container 40 were exhausted to a vacuum. After that, the substrate 1 was heated at 600° C. for several tens minutes by the use of a gas including hydrogen, and consequently the Pd—Co layer was reduced, and aggregated to form catalyst layers composed of active catalyst particles.

Next, in the reaction container 40 of the aforesaid thermal CVD apparatus, fibers were grown on the catalyst layers. In the present example, a high pressure cylinder containing 1% of an acetylene gas (99% of a helium gas) was prepared as the carbon containing gas cylinder 50, and a high pressure cylinder containing a high purity hydrogen gas was prepared as the carrier gas cylinder 55.

(Step 5)

The valve 44 was opened, and the gases inside the reaction container 40 were exhausted with the vacuum pumping apparatus 45 until the pressure became about $1 \times 10^{-4}$ Pa.

(Step 6)

Next, the valves 51, 53, 56 and 58 were opened. The quantity of flow of the carbon containing gas was controlled with the mass flow controller 52 to introduce 0.02 sccm to 100 scccm of the carbon containing gas into the reaction container 40. Moreover, the quantity of flow of the hydrogen was controlled by the mass flow controller 57 as a diluent gas to introduce 1 sccm to 100 sccm of the hydrogen gas into the reaction container 40.

The quantities of flow of the gases and the conductance of the valve 44 were suitably controlled in order that the total pressure of the reaction container 40 might be 2000 Pa. The micro quantity of flow valve 46 was opened to measure the partial pressures of the carbon containing gas components in the apparatus (the partial pressures of the hydrogen gas and the acetylene gas were measured, and the partial pressures were obtained by converting from the total pressure value from the Baratron vacuum gage 48 in the present example).

Next, the electric power to be thrown into the heat source 41 was adjusted in order that the temperature of the substrate 1 might become about 600° C. to grow a plurality of carbon fibers. The growth time was 20 minutes.

The film thicknesses of the carbon fibers-grown as described above were measured at the cross section SEM as described above, and S-parameters were obtained.

Figure 14:
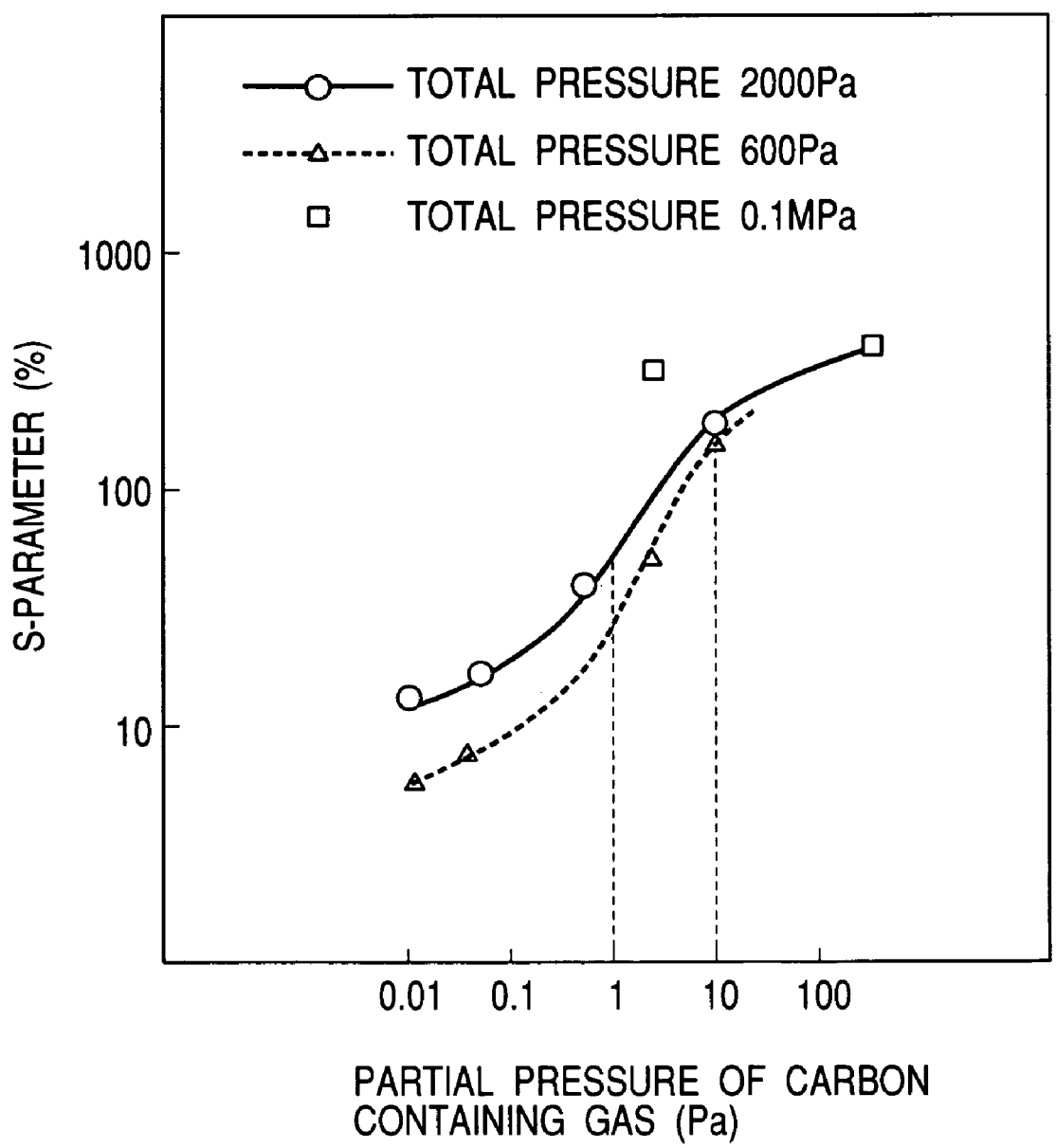
FIG. 14 is a view showing relations between partial pressures of a carbon containing gas and S-parameters in an example of the present invention.

Relations between each growth partial parameter and the S-parameters when total pressures and a growth temperature were set to be constant are shown in FIG. 14.

FIG. 14 shows representative data obtained under the conditions such tat the growth temperature was 600° C. and the total pressures in the reaction container 40 were 600 Pa (reduced pressure), 2000 Pa (reduced pressure) and 0.1 MPa (corresponding to the atmospheric pressure). Both of the X-axis and the Y-axis in FIG. 14 are logarithmically scaled.

As shown in FIG. 14, under the condition of the reduced pressures of the total pressures, the deviation (unevenness) steeply starts to reduce in the regions of 10 Pa or less of the partial pressures of the carbon containing gases. Moreover, when the total pressure in the reaction container 40 is exchanged between 2000 Pa and 600 Pa, the deviation (unevenness) can be decreased in case of the lower total pressure. Incidentally, when the Pd—Co alloy layers and the acetylene gas were used as the catalyst layers and the carbon containing gas, respectively, the growth rates of the carbon fibers became very slow when the total pressure was 66 Pa or less. Moreover, regardless of the total pressures, when the partial pressure of the carbon containing gas was set to 0.01 Pa, an inclination of the deviation (unevenness) rather to increase was obtained. From these results, when the Pd—Co alloy catalyst and the acetylene gas were used, it is preferable that the total pressure is larger than 66 Pa and the partial pressure of the carbon containing gas is larger than 0.01 Pa.

Example 2

In the present example, a plurality of substrates having different formation areas of the catalyst layers thereon was produced in order that the total area of the catalyst layer disposed in the reaction container 40 might be 5000 mm$^2$ by the method similar to that of the example 1. Then, carbon fibers were grown.

(Step 1)

Catalyst layers were formed on a substrate by the similar method as that of the example 1.

(Step 2)

The substrate on which the catalyst layers were formed was disposed in the reaction container 40 of the thermal CVD apparatus shown in FIG. 4, and the gases in the reaction container 40 ware exhausted to a vacuum. After that, the substrate was heated at about 600° C. for several tens minutes by the use of a gas including hydrogen, and consequently the Pd—Co layer was reduced, and aggregated to form catalyst layers composed of active catalyst particles.

Next, in the reaction container 40 of the aforesaid thermal CVD apparatus, fibers were grown on the catalyst layers. In the present example, a high pressure cylinder containing 1% of an acetylene gas (99% of a helium gas) was prepared as the carbon containing gas cylinder 50, and a high pressure cylinder containing a high purity hydrogen gas was prepared as the carrier gas cylinder 55.

(Step 3)

The valve 44 was opened, and the gases inside the reaction container 40 were exhausted with the vacuum pumping apparatus 45 until the pressure became about $1 \times 10^{-4}$ Pa.

(Step 4)

Next, the valves 51, 53, 56 and 58 were opened. The quantities of flows of the carbon containing gas and the diluent gas were controlled by the mass flow controllers 52 and 57 to introduce the gases into the reaction container 40.

The quantities of flow of the gases and the conductance of the valve 44 were suitably controlled in order that the total pressure of the reaction container 40 might be 532 Pa. In this state, the micro quantity of flow valve 46 was opened to measure the partial pressure of the carbon containing gas component in the apparatus. The measured partial pressure was 1 Pa.

Next, the electric power to be thrown into the heat source 41 was adjusted in order that the temperature of the substrate 1 might become about 600° C. to grow a plurality of carbon fibers. The growth time was 20 minutes.

When the partial pressure of the carbon containing gas component in the reaction container 40 was measured during the growth of the carbon fibers by opening the micro quantity of flow valve 46, the measured partial pressure of the carbon containing gas was 0.02 Pa. Provided that a partial pressure in the state in which the growth of the carbon fibers has not started yet before the throwing in of the electric power to the heat source 41 is designated by a reference mark Pn, and that a partial pressure during the growth of the carbon fibers is designated by a reference mark Pg, then consumption efficiency is expressed by a formula: (Pn−Pg)×100/Pn. The consumption efficiency of the present example was 98%.

Figure 15:
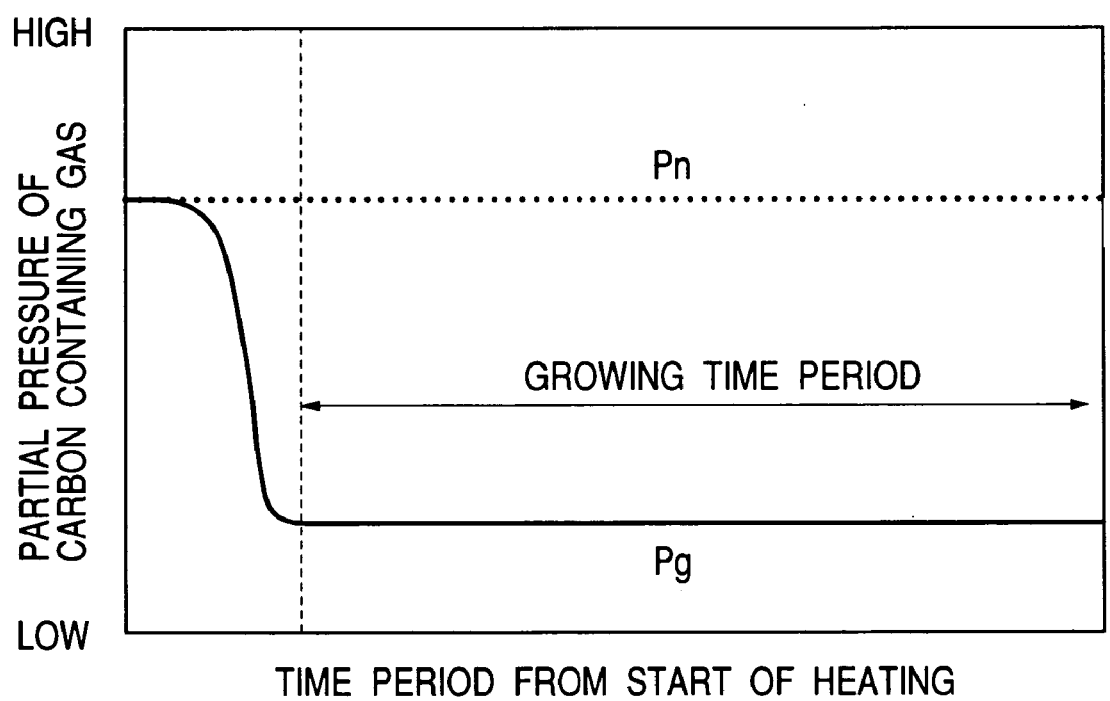
FIG. 15 is a view showing an relation between partial pressures of the carbon containing gas and time periods from a start of heating in the example of the present invention.

FIG. 15 shows a change with the passage of time of the partial pressure of the carbon containing gas of the present example. As shown in FIG. 15, when electric power is thrown into the heat source 41 and heating is started, the temperature of the substrate 1 rises, and the partial pressure of the carbon containing gas starts to decrease from the partial pressure Pn mentioned above. After that, when the temperature of the substrate 1 reaches about 600° C., the temperature becomes a stable state. The partial pressure in the stable state is the aforesaid partial pressure Pg.

Films including a plurality of carbon fibers were formed by the method described above. Thereby, a plurality of carbon fiber films having little dispersion of their film thicknesses depending on positions in the reaction container 40 could be obtained. In addition, the use efficiency of the carbon containing gas was very high, and the manufacturing of these carbon fiber films needed a low cost.

Example 3

In the present example, films including a plurality of carbon fibers were produced similarly to the Example 2 except that the total pressure was set 800 Pa and the partial pressure of an acetylene gas was 1 Pa in the measurement conditions similar to those of the Example 2. As a result, the S-parameters were stayed at a value between the value at the 600 Pa of the total pressure and 1 Pa of the partial pressure of the carbon containing gas and a value at 2000 Pa of the total pressure and 1 Pa of the partial pressure of the carbon containing gas.

Example 4

In the present example, an ethylene gas was used as the carbon containing gas, and carbon fibers were grown by a procedure similar to that of the Example 2.

(Step 1)

Catalyst layers were formed on a substrate by the similar method to that of the example 1.

(Step 2)

The substrate on which the catalyst layers were formed was disposed in the reaction container 40 of the thermal CVD apparatus shown in FIG. 4, and the gases in the reaction container 40 ware exhausted to a vacuum. After that, the substrate was heated at 600° C. for several tens minutes by the use of a gas including hydrogen, and consequently the Pd—Co layer was reduced, and aggregated to form catalyst layers composed of active catalyst particles.

Next, in the reaction container 40 of the aforesaid thermal CVD apparatus, fibers were grown on the catalyst layers. In the present example, a high pressure cylinder containing a high purity ethylene gas was prepared as the carbon containing gas cylinder 50, and a high pressure cylinder containing a high purity hydrogen gas was prepared as the carrier gas cylinder 55.

(Step 3)

The valve 44 was opened, and the gases inside the reaction container 40 were exhausted with the vacuum pumping apparatus 45 until the pressure became about $1 \times 10^{-4}$ Pa.

(Step 4)

Next, the valves 51, 53, 56 and 58 were opened. The quantities of flows of the carbon containing gas and the diluent gas were controlled by the mass flow controllers 52 and 57 to introduce the gases into the reaction container 40.

The quantities of flow of the gases and the conductance of the valve 44 were suitably controlled in order that the total pressure of the reaction container 40 might be 1330 Pa. In this state, the micro quantity of flow valve 46 was opened to measure the partial pressure of the carbon containing gas component in the apparatus. The measured partial pressure was 10 Pa.

Next, the electric power to be thrown into the heat source 41 was adjusted in order that the temperature of the substrate 1 might become about 600° C. to grow a plurality of carbon fibers. The growth time was 20 minutes. By the method described above, a plurality of carbon fiber films having little dispersion of their film thicknesses depending on positions in the reaction container 40 could be obtained.

Example 5

Next, a substrate composed of an insulating substrate made of quartz and pulling out electrodes and cathode electrodes, both made of TiN, formed on the insulating substrate was used. The total pressure in the reaction container 40 was set to be 1800 Pa, and the partial pressure of an acetylene gas was set to be 5 Pa. The substrate 1 was heated up to 600° C. The other conditions were set to be the same as those of the Example 1. Thus, carbon fibers were grown on the cathode electrodes, and an electron-emitting device using the carbon fibers as electron-emitting members was produced.

An anode electrode was arranged at a position higher than the substrate 1 of the obtained electron-emitting device by 200 μm. A positive pole of a power source was connected to the anode electrode. Thus, an electron emission characteristic of a direct current (a characteristic of electron emission currents to anode voltages) was evaluated. Incidentally, for avoiding the concentration of an electric field on the outer peripheral part of each region on which carbon fibers were formed, the position where the anode was disposed was devised in order that the anode might be located inside of the carbon fiber formation regions.

As a result, independently of the areas of the carbon fibers, the uniformity of the threshold electric fields for electron emission necessary for taking out an electron emission current Ie of 10 mA/cm$^2$ was high.

Example 6

The total pressure in the reaction container 40 was set to be 600 Pa. Formation region of fibers were set to have a width of 8 μm, a length of 300 μm. The partial pressure of the acetylene gas was set to be 1 Pa. The other conditions were set to be the same as those of the Example 5. Thus, an electron source including a plurality of electron-emitting devices on the same substrate (see FIG. 11) was produced.

To the electron source thus produced, a voltage was applied to the X-direction wiring Dx1-Dxm while being switched sequentially, and at the same time the same voltage was applied to the Y-direction wiring Dy1-Dyn (a line sequential drive). Consequently, electron emission having high uniformity was obtained from each electron-emitting device.

Example 7

An image-forming apparatus shown in FIG. 12 was produced by the use of the electron source produced at the Example 6. As the face plate 130, a face plate substrate including a phosphor film 128 made of three original color (red, blue and green) phosphors, and the metal back 127 having a role of an anode electrode. Joining parts of the supporting frame 124, the face plate 130 and the rear plate 123 were coupled with a sealing agent such as a frit. The inside of the image-forming apparatus was kept at a vacuum in a range of from 5 Pa to 10 Pa.

In the image-forming apparatus produced in the present example, each electron-emitting device was individually controlled to be driven. Consequently, a display image having high brightness and high uniformity could be obtained.

Example 8

A cathode electrode made of TiN was formed on a stainless steel substrate. The partial pressure of the acetylene gas in the reaction container 40 was set to be 5 Pa, and the total pressure in the reaction container 40 was set to be 500 Pa. The other conditions were set to be the same as those of the Example 1. Then, a film including a plurality of carbon fibers was grown on the cathode electrode. Thus, a light bulb (see FIG. 13) using the film including the plurality of carbon fibers as the electron-emitting member was produced. In the present example, a phosphor emitting green light was used.

The pressure in the inside of the light bulb of the present example was kept to be $10^{-5}$ Pa or more. When a voltage of 10 kV was applied to the anode electrode 143 in this state, light emission having high brightness could be obtained uniformly over the whole surface of the phosphor 144.

As described above, according to the present invention, the dispersion of film thicknesses of carbon fibers can be reduced regardless of the areas, the arrangement density and the like of the carbon fibers. Then, the carbon fibers having a uniform film thickness can be easily manufactured over a wide range. Consequently, according to the present invention, by using the carbon fibers as electron emitting members, an electron-emitting device and a light bulb having superior electron emission characteristics can be provided. Moreover, by using the electron-emitting devices, an electron source having uniform electron emission characteristics and an image-forming apparatus having a high image quality can be provided more inexpensively. Furthermore, a secondary battery and a hydrogen occlusion body, both capable of being used in wide areas and using the carbon fibers as their components, can be provided.

What is claimed is:

1. A method for manufacturing carbon fibers by means of a thermal CVD method, said met hod comprising at least a step of heating a substrate including a catalyst arranged on a surface of said substrate in a depressurized atmosphere including a carbon containing gas to grow carbon fibers by using said catalyst wherein a partial pressure of the carbon containing gas is 1/1000 or less of a total pressure of the depressurized atmosphere, and is 10 Pa or less.

2. A method for manufacturing carbon fibers by means of a thermal CVD method, said method comprising at least a step of heating a substrate including a catalyst arranged on a surface of said substrate in a depressurized atmosphere including a carbon containing gas to grow carbon fibers by using said catalyst, wherein a total pressure of the depressurized atmosphere is 2000 Pa or less, and a partial pressure of the carbon containing gas is 10 Pa or less.

3. A method for manufacturing carbon fibers by means of a thermal CVD method, said method comprising at least a step of heating a substrate including a catalyst arranged on a surface of said substrate in a depressurized atmosphere including a carbon containing gas to grow carbon fibers by using said catalyst, wherein a total pressure of the depressurized atmosphere is 600 Pa or less, and a partial pressure of the carbon containing gas is 10 Pa or less.

4. A method for manufacturing carbon fibers according to claim 1, wherein the partial pressure of the carbon containing gas is 1 Pa or less.

5. A method for manufacturing carbon fibers according to claim 2, wherein the partial pressure of the carbon containing gas is 1 Pa or less.

6. A method for manufacturing carbon fibers according to claim 3, wherein the partial pressure of the carbon containing gas is 1 Pa or less.

7. A method for manufacturing carbon fibers according to claim 1 wherein said carbon containing gas is introduced into the depressurized atmosphere together with a carrier gas.

8. A method for manufacturing carbon fibers according to claim 7, wherein said carrier gas is a hydrogen gas.

9. A method for manufacturing carbon fibers according to claim 7, wherein said carrier gas is an inert gas.

10. A method for manufacturing carbon fibers according to claim 1, wherein said carbon containing gas is a carbon hydride gas.

11. A method for manufacturing carbon fibers according to claim 1, wherein said carbon containing gas is an acetylene gas.

12. A method for manufacturing carbon fibers according to claim 2, wherein said carbon containing gas is an acetylene gas.

13. A method for manufacturing carbon fibers according to claim 3, wherein said carbon containing gas is an acetylene gas.

14. A method for manufacturing carbon fibers according to claim 1, wherein said catalyst is composed of a plurality of catalyst particles.

15. A method for manufacturing carbon fibers according to claim 1, wherein said catalyst is composed of a plurality of catalyst particles, and said catalyst particles are made of an alloy of Pd arid Co.

16. A method for manufacturing carbon fibers according to claim 2, wherein said catalyst is composed of a plurality of catalyst particles, and said catalyst particles are made of an alloy of Pd and Co.

17. A method for manufacturing carbon fibers according to claim 3, wherein said catalyst is composed of a plurality of catalyst particles, and said catalyst particles are made of an alloy Pd and Co.

18. A method for manufacturing carbon fibers according to claim 1, wherein said carbon fibers are graphite nanofibers.

19. A method for manufacturing an electron-emitting device using carbon fibers as electron-emitting members, wherein said carbon fibers are manufactured by a manufacturing method according to claim 1.

20. A method for manufacturing an electron source composed of plurality of electron-emitting devices arranged on a substrate, wherein said electron-emitting devices are manufactured by a manufacturing method according to claim 19.

21. A method for manufacturing an image display apparatus including an electron source and an image-forming member arranged to be opposed to said electron source, wherein said electron source is manufactured by a manufacturing method according to claim 20.

22. A method for manufacturing a light bulb including an electron-emitting body using carbon fibers as electron-emitting members, and a light-emitting member, wherein said carbon fibers are made by a manufacturing method according to claim 1.

23. A method for manufacturing a secondary battery using carbon fibers as cathodes, wherein said carbon fibers are manufactured by a manufacturing method according to claim 1.

* * * * *

UNITED STATES PATENT AND TRADEMARK OFFICE
CERTIFICATE OF CORRECTION

PATENT NO. : 7,104,859 B2
APPLICATION NO. : 10/802854
DATED : September 12, 2006
INVENTOR(S) : Takeo Tsukamoto et al.

It is certified that error appears in the above-identified patent and that said Letters Patent is hereby corrected as shown below:

COLUMN 3:

Line 23, "the-electron-emitting" should read --the electron-emitting--.

COLUMN 7:

Line 40, "numeral,45" should read --numeral 45--; and
Line 57, "a-carbon" should read --a carbon--.

COLUMN 8:

Line 27, "the-carbon" should read --the carbon--.

COLUMN 13:

Line 60, "in-accordance" should read --in accordance--.

COLUMN 15:

Line 65, "fibers-grown" should read --fibers grown--.

UNITED STATES PATENT AND TRADEMARK OFFICE
CERTIFICATE OF CORRECTION

PATENT NO. : 7,104,859 B2
APPLICATION NO. : 10/802854
DATED : September 12, 2006
INVENTOR(S) : Takeo Tsukamoto et al.

It is certified that error appears in the above-identified patent and that said Letters Patent is hereby corrected as shown below:

<u>COLUMN 20</u>:

Line 5, "met hod" should read --method--;
Line 38, "claim 1" should read --claim 1,--; and
Line 63, "arid" should read --and--.

Signed and Sealed this

Twenty-second Day of May, 2007

JON W. DUDAS
*Director of the United States Patent and Trademark Office*